(12) United States Patent
Tomiha et al.

(10) Patent No.: US 9,927,504 B2
(45) Date of Patent: Mar. 27, 2018

(54) MAGNETIC RESONANCE IMAGING APPARATUS

(71) Applicant: TOSHIBA MEDICAL SYSTEMS CORPORATION, Otawara-Shi, Tochigi-Ken (JP)

(72) Inventors: Sadanori Tomiha, Nasushiobara (JP); Hiroki Motohashi, Otawara (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 1193 days.

(21) Appl. No.: 14/058,700

(22) Filed: Oct. 21, 2013

(65) Prior Publication Data

US 2014/0070811 A1 Mar. 13, 2014

Related U.S. Application Data

(63) Continuation of application No. PCT/JP2013/074224, filed on Sep. 9, 2013.

(30) Foreign Application Priority Data

Sep. 12, 2012 (JP) ................................. 2012-200768

(51) Int. Cl.
*G01V 3/00* (2006.01)
*G01R 33/36* (2006.01)
*G01R 33/3415* (2006.01)

(52) U.S. Cl.
CPC .......... *G01R 33/36* (2013.01); *G01R 33/3415* (2013.01); *G01R 33/3621* (2013.01); *G01R 33/3692* (2013.01)

(58) Field of Classification Search
CPC .................................................. G01R 33/3692
(Continued)

(56) References Cited

U.S. PATENT DOCUMENTS

| 5,384,536 A | 1/1995 | Murakami et al. |
| 5,928,145 A | 7/1999 | Ocali et al. |

(Continued)

FOREIGN PATENT DOCUMENTS

| CN | 101325427 A | 12/2008 |
| CN | 101796743 A | 8/2010 |

(Continued)

OTHER PUBLICATIONS

CN Office Action dated Sep. 6, 2015 in in CN 201380002681.9.
(Continued)

*Primary Examiner* — Louis Arana
(74) *Attorney, Agent, or Firm* — Nixon & Vanderhye P.C.

(57) ABSTRACT

MRI apparatus includes an RF coil device, a first radio communication unit, a second radio communication unit, an image reconstruction unit and a judging unit. The RF coil device detects an MR signal, and includes a data saving unit for storing the MR signal. The first radio communication unit wirelessly transmits the MR signal detected by the RF coil device, and the second radio communication unit receives the MR signal from the first radio communication unit. The image reconstruction unit reconstructs image data using the MR signal. The judging unit judges existence of a transmission error in radio communication between the first and second radio communication units. If the transmission error is present, the first radio communication unit wirelessly transmit the MR signal stored in the data saving unit to the second radio communication unit.

19 Claims, 14 Drawing Sheets

(58) Field of Classification Search
USPC .................................... 324/322, 318, 314
See application file for complete search history.

(56) References Cited

U.S. PATENT DOCUMENTS

| | | | |
|---|---|---|---|
| 6,263,229 | B1 | 7/2001 | Atalar et al. |
| 6,549,800 | B1 | 4/2003 | Atalar et al. |
| 6,675,033 | B1 | 1/2004 | Lardo et al. |
| 7,230,425 | B2 * | 6/2007 | Leussler ............ G01R 33/3692 324/318 |
| 8,952,697 | B2 * | 2/2015 | Schmidt ............ G01R 33/3621 324/318 |
| 9,229,075 | B2 * | 1/2016 | Cho ........................ G01R 33/36 |
| 2001/0056232 | A1 | 12/2001 | Lardo et al. |
| 2002/0040185 | A1 | 4/2002 | Atalar et al. |
| 2002/0045816 | A1 | 4/2002 | Atalar et al. |
| 2003/0028094 | A1 | 2/2003 | Kumar et al. |
| 2003/0028095 | A1 | 2/2003 | Tulley et al. |
| 2004/0199071 | A1 | 10/2004 | Lardo et al. |
| 2006/0116550 | A1 | 6/2006 | Noguchi et al. |
| 2006/0122493 | A1 | 6/2006 | Atalar et al. |
| 2007/0238978 | A1 | 10/2007 | Kumar et al. |
| 2008/0311849 | A1 | 12/2008 | Washiro |
| 2009/0267601 | A1 | 10/2009 | Van Helvoort et al. |
| 2009/0322335 | A1 | 12/2009 | Adachi et al. |
| 2011/0274183 | A1 | 11/2011 | Wang |

FOREIGN PATENT DOCUMENTS

| | | |
|---|---|---|
| JP | 5-261083 | 10/1993 |
| JP | 05-261083 | 10/1993 |
| JP | 2001-346775 | 12/2001 |
| JP | 2003/525654 | 9/2003 |
| JP | 2006-255189 | 9/2006 |
| JP | 2008-518652 | 6/2008 |
| JP | 2008-312252 | 12/2008 |
| JP | 2009-142395 | 7/2009 |
| JP | 2010-029644 | 2/2010 |
| JP | 2010-537699 | 12/2010 |
| JP | 2012-050507 | 3/2012 |
| WO | 2005/077249 A1 | 8/2005 |

OTHER PUBLICATIONS

JP Office Action dated Aug. 2, 2016 in JP 2012-200768.
Wei, J. et al., "Digital Wireless Transmission for MRI," Proc. Intl. Soc. Mag. Reson. Med 14 (2006), p. 3542.
Shen, G.X. et al., "Design of Digital Wireless Transmission for 64 Channel Array Using IEEE 802.11n," Proc. Intl. Soc. Mag. Reson. Med 16 (2008), p. 1121.
English Translation of International Preliminary Report on Patentability dated Mar. 17, 2015 for Application No. PCT/JP2013/074224.

* cited by examiner

THERE IS A TRANSMISSION ERROR IN A PART OF MR SIGNALS DETECTED BY THE RF COIL DEVICE FOR THE CHEST PART.

PLEASE TAKE THE MEMORY ELEMENT 160b OUT OF THE RF COIL DEVICE FOR THE CHEST PART, AND CONNECT IT TO THE DATA COLLECTING UNIT 600.

MAGNETIC RESONANCE IMAGING APPARATUS

CROSS-REFERENCE TO RELATED APPLICATIONS

This application is a Continuation application of No. PCT/JP2013/74224, filed on Sep. 9, 2013, and the PCT application is based upon and claims the benefit of priority from Japanese Patent Application No. 2012-200768, filed on Sep. 12, 2012, the entire contents of which are incorporated herein by reference.

BACKGROUND OF THE INVENTION

1. Field of the Invention

Embodiments described herein relate generally to a magnetic resonance imaging apparatus.

2. Description of the Related Art

MRI is an imaging method which magnetically excites nuclear spin of an object (a patient) set in a static magnetic field with an RF pulse having the Larmor frequency and reconstructs an image on the basis of MR signals generated due to the excitation. The aforementioned MRI means magnetic resonance imaging, the RF pulse means a radio frequency pulse, and the MR signal means a nuclear magnetic resonance signal.

Here, an RF (Radio Frequency) coil device is a device which transmits an RF pulse to nuclear spin inside an object by, for example, supplying a coil with an RF pulse electric current and detects generated MR signals.

Some of RF coil devices are built-in type included in an MRI apparatus and other RF coil devices are recognized by a control unit of the MRI apparatus by being connected to a connection port of the MRI apparatus such as local RF coil devices, for example.

In MRI, multi-channel structure is promoted in acquisition system of MR signals. The above "channel" means each pathway of a plurality of MR signals outputted from each coil element and inputted to an RF receiver of an MRI apparatus. Although the number of channels is set to equal to or smaller than the input reception number of the RF receiver, a large number of RF coil devices can be connected to an MRI apparatus.

If the number of cables between an RF coil device and an MRI apparatus increases due to promotion of the aforementioned multichannel structure, it is inconvenient because hard-wiring becomes complicated.

Therefore, it is desired to unwire transmission and reception of signals between an RF coil device and an MRI apparatus. However, radio communication by an analogue signal has not been achieved, because there are various restrictions such as degradation of dynamic range.

More specifically, in order to suppress influence on receiving sensitivity to weak MR signals emitted from an object, it is impossible in an MRI apparatus to enlarge the output of electromagnetic waves used for radio communication between an RF coil device and an MRI apparatus. If it is impossible to enlarge the radio output power, dynamic range degrades due to signal loss caused when transmitted signals travel space. Then, in Japanese Patent Application Laid-open (KOKAI) Publication No. 2010-29664, "digital radio communication method in which MR signals are digitized and then transmitted wirelessly" is proposed.

Although the problem of restriction of dynamic range can be solved by wirelessly transmitting MR signals after digitalization, this method has the following problems.

Firstly, regulation of radio communication is different from country to country, and the same transmission frequency or the same transmission power cannot be necessarily used in other countries.

Secondly, if MR signals are wirelessly transmitted from an RF coil device to an MRI apparatus, the transmitted radiowaves are reflected off surrounding areas and this degrades own data of radio communication.

Therefore, a novel technology to wirelessly transmit digitized MR signals from an RF coil device to an MRI apparatus satisfactorily has been desired in MRI.

DETAILED DESCRIPTION

Figure 1:
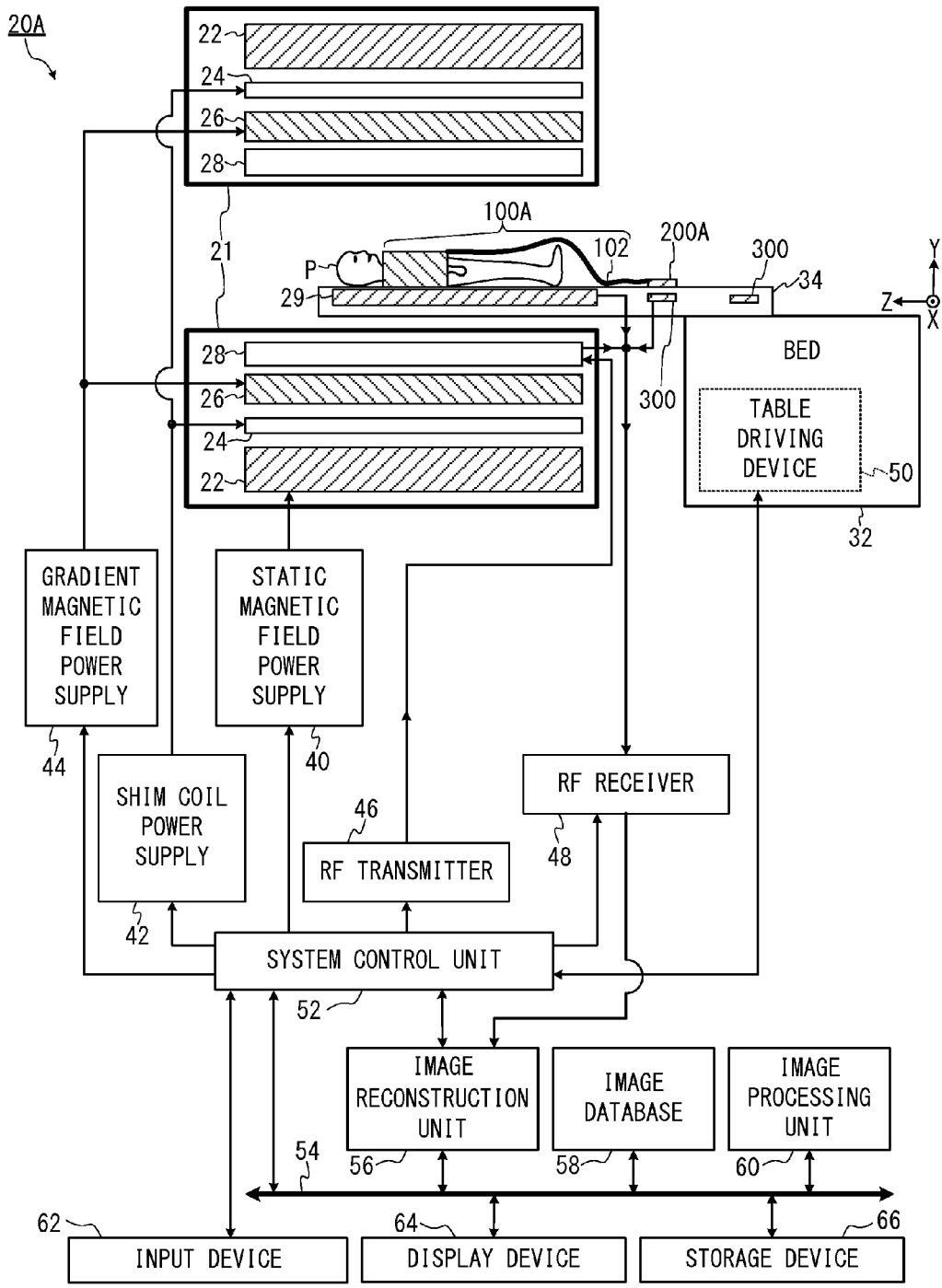
FIG. 1 is a block diagram showing the general structure of the MRI apparatus of the first embodiment.

In the following embodiments, "a first radio communication unit and a second radio communication unit both of which are capable of radio communication via an induced electric field" are disposed on an RF coil device side and a control side of an MRI apparatus respectively. In this case, the first radio communication unit is detachably fixed to the second radio communication unit within near distance, for example, and digitized MR signals are wirelessly transmitted from the first radio communication unit to the second radio communication unit via an induced electric field.

The aforementioned assignment of wirelessly transmitting digitized MR signals from an RF coil device to a control side of an MRI apparatus satisfactorily can be achieved by the above novel technology.

In the above configuration, there is a possibility of occurring communication failure due to reasons as follows. For example, the RF coil device set on an object may be moved due to large movement of the object during imaging, and this stirs the first radio communication unit connected to the RF coil device with a cable. In such a case, there is a possibility that a part of data of MR signals to be normally and wirelessly transmitted becomes a transmission error on the receiving side.

The above transmission error means, for example, transmission of incorrect data, lack of data and so on. Thus, "a configuration in which a transmission error is compensated even in the case of a communication disturbance" is preferable. Then, in the following embodiments, it is a further assignment to compensate a transmission error of data of MR signals caused by communication disturbance.

For example, according to one embodiment, an MRI apparatus includes an RF coil device, a first radio communication unit, a second radio communication unit, an image reconstruction unit and a judging unit.

The RF coil device detects an MR signal emitted from an object and digitizes the MR signal. In addition, the RF coil device includes a data saving unit that stores the detected MR signal.

The first radio communication unit wirelessly transmits the digitized MR signals.

The second radio communication unit receives the MR signal wirelessly transmitted from the first radio communication unit.

The image reconstruction unit reconstructs image data on the basis of the MR signal received by the second radio communication unit.

The judging unit judges whether or not a transmission error of data of the MR signal is present in radio communication between the first radio communication unit and the second radio communication unit. When the judging unit judges that the transmission error is present, the first radio communication unit wirelessly transmits the MR signal stored in the data saving unit to the second radio communication unit.

Examples of embodiments of magnetic resonance imaging apparatuses and magnetic resonance imaging methods to which the aforementioned configuration are applied will be concretely described with reference to the accompanying drawings as follows.

Note that the same reference numbers are given for identical components in each figure, and overlapping explanation is abbreviated.

The First Embodiment

FIG. 1 is a block diagram showing an example of the general structure of the MRI apparatus 20A according to the first embodiment. As shown in FIG. 1, the MRI apparatus 20A includes a gantry 21, a bed 32 and a table 34. The table 34 is movably disposed on the bed 32 so as to be supported by the bed 32. In addition, in the gantry 21 which is cylinder-shaped as an example, the MRI apparatus 20A includes a static magnetic field magnet 22, a shim coil 24, a gradient magnetic field coil 26 and a transmission RF coil 28. The gantry 21 corresponds to the parts indicated as bold line frames in FIG. 1.

An object P is set on the table 34. The static magnetic field magnet 22 and the shim coil 24 are, for example, cylinder-shaped. Inside the static magnetic field magnet 22, the shim coil 24 is arranged so as to become coaxial with the static magnetic field magnet 22.

As an example here, an apparatus coordinate system, whose X axis, Y axis and Z axis are perpendicular to each other, is defined as follows.

Firstly, it is assumed that the static magnetic field magnet 22 and the shim coil 24 are arranged in such a manner that their axis direction accords with the vertical direction. And the direction of the axis of the static magnetic field magnet 22 and the shim coil 24 is defined as the Z axis direction. In addition, it is assumed that the vertical direction is the same as the Y axis direction. Moreover, it is assumed that the table 34 is disposed in such a position that the direction of "the normal line of the loading plane thereof" is the same as the Y axis direction.

The MRI apparatus 20A includes, on its control side, a static magnetic field power supply 40, a shim coil power supply 42, a gradient magnetic field power supply 44, an RF transmitter 46, an RF receiver 48, a table driving device 50, a system control unit 52, a system bus 54, an image reconstruction unit 56, an image database 58, an image processing unit 60, an input device 62, a display device 64 and a storage device 66. Incidentally, the table driving device 50 is arranged inside the bed 32.

The static magnetic field magnet 22 forms a static magnetic field in an imaging space by using an electric current supplied from the static magnetic field power supply 40. The aforementioned "imaging space" means, for example, a space in the gantry 21 in which the object P is placed and to which a static magnetic field is applied.

The static magnetic field magnet 22 includes a superconductivity coil in many cases. The static magnetic field magnet 22 gets the electric current from the static magnetic field power supply 40 at excitation. However, once excitation has been made, the static magnetic field magnet 22 is usually isolated from the static magnetic field power supply 40. The static magnetic field magnet 22 may include a permanent magnet which makes the static magnetic field power supply 40 unnecessary.

The shim coil 24 is electrically connected to the shim coil power supply 42 and uniforms the static magnetic field with the electric current supplied from the shim coil power supply 42.

The gradient magnetic field coil 26 is, for example, arranged in the form of a cylinder inside the static magnetic field magnet 22. The gradient magnetic field coil 26 generates a gradient magnetic field Gx in the X axis direction, a gradient magnetic field Gy in the Y axis direction and a gradient magnetic field Gz in the Z axis direction in the imaging region, by using electric currents supplied from the gradient magnetic field power supply 44.

That is, directions of "a gradient magnetic field Gss in a slice selection direction", "a gradient magnetic field Gpe in a phase encoding direction" and "a gradient magnetic field Gro in a readout (frequency encoding) direction" can be arbitrarily set as logical axes, by combining the gradient magnetic fields Gx, Gy and Gz in the three axes of the apparatus coordinate system.

Note that, the above "imaging region" means, for example, a region set as a part of the imaging space and is a range of acquisition of MR signals used to generate "one image" or "one set of image". Here, "one set of images" means, for example, a plurality of images when MR signals of the plurality of images are acquired in a lump in one pulse sequence such as multi-slice imaging. The imaging region is defined three-dimensionally in an apparatus coordinate system, for example.

The RF transmitter 46 generates RF pulses in accordance with control information provided from the system control unit 52, and transmits the generated RF pulses to the transmission RF coil 28. The transmission RF coil 28 transmits RF pulses given from the RF transmitter 46 to the object P. The transmission RF coil 28 also includes "a whole body coil (not shown) which is included in the gantry 21 and used for both transmission of RF pulses and detection of MR signals".

The reception RF coil 29 is disposed inside the table 34. The reception RF coil 29 detects MR signals generated due to excited nuclear spin inside the object P by the RF pulse, and transmits the detected MR signals to the RF receiver 48.

The RF coil device 100A is, for example, a wearable local RF coil device for detecting MR signals. Here, "the RF coil device 100A which is set on the chest part and detects MR signals from the chest part" is shown, but this is only an example. In the MRI apparatus 20A, various wearable RF coil devices such as a shoulder RF coil device and a lumbar part RF coil device 100α (see later-described FIG. 10) can be used for detection of MR signals aside from the RF coil device 100A.

As an example here, each of these RF coil devices (100A, 100α) for detecting MR signals are interpreted as a part of the MRI apparatus 20A. However, these RF coil devices may be interpreted as separated components from the MRI apparatus 20A.

The RF coil device 100A includes a cable 102, and is connected to the coil side radio communication device 200A by the cable 102.

Inside the table 34, a plurality of control side radio communication devices 300 are arranged. The aforementioned radio communication of digitized MR signals is performed between one coil side radio communication device 200A and one of the control side radio communication devices 300.

However, in the case of setting a plurality of RF coil devices on the object P as an example, the present embodiment is not limited to the above aspect. In such a case, for example, radio communication of the digitized MR signals is respectively performed between "each of the plurality of the coil side radio communication devices 200A respectively corresponding to the RF coil devices" and "each of the plurality of the control side radio communication devices 300 respectively corresponding to the plurality of the coil side radio communication devices 200A".

Thus, the coil side radio communication device 200A of the MRI apparatus 20A is an example of the first radio communication unit described in the claims, and the control side radio communication devices 300 of the MRI apparatus 20A is an example of the second radio communication unit described in the claims. Operation of the radio communication will be described later.

Note that, though only two of the control side radio communication devices 300 are shown in FIG. 1 to avoid complication, the number of the control side radio communication devices 300 may be one, three or more than three.

However, configuration of including many of the separately arranged control side radio communication devices 300 is more preferable than configuration of including only one control side radio communication device 300. This is because the former has more choices to closely fix the coil side radio communication device 200A to the control side radio communication device 300.

In other words, if there are more choices of a fixing position, the coil side radio communication device 200A can be fixed on the nearest control side radio communication device 300 thereto. If it is fixed in such a manner, the cable 102 between the RF coil device 100A and the coil side radio communication device 200A can be shortened.

Note that, the aforementioned "closely fix" means, for example, to fix mutually immovably within a range (distance) of being mutually electromagnetically coupled so as to be capable of radio communication via an induced electric field.

In addition, as an example in the present embodiment, transmission of an RF pulse to the transmission RF coil 28 inside the MRI apparatus 20A and transmission of MR signals detected from the object P are performed under wire transmission except the pathway between the coil side radio communication device(s) 200A and the control side radio communication device(s) 300.

The RF receiver 48 generates complex number data of digitized MR signals (hereinafter, referred to as raw data of MR signals) by performing predetermined signal processing. The RF receiver 48 inputs the generated raw data of MR signals to the image reconstruction unit 56.

The system control unit 52 performs system control of the entirety of the MRI apparatus 20A in imaging operation and an image display after the imaging operation via interconnection lines such as the system bus 54.

For the sake of achieving the above control, the system control unit 52 stores control information needed in order to make the gradient magnetic field power supply 44, the RF transmitter 46 and the RF receiver 48 drive. The aforementioned "control information" includes, for example, sequence information describing operation control information such as intensity, application period and application timing of the pulse electric currents which should be applied to the gradient magnetic field power supply 44.

The system control unit 52 generates the gradient magnetic fields Gx, Gy and Gz and RF pulses by driving the gradient magnetic field power supply 44, the RF transmitter 46 and the RF receiver 48 in accordance with a predetermined sequence stored.

In addition, the system control unit 52 can change the height of the bed 32 so as to move up and down the table 34 in the Y axis direction by controlling the table driving device 50 (when the table 34 is at a predetermined position outside the gantry 21). In addition, the system control unit 52 makes the table 34 move into and out of the imaging space in the gantry 21 in the Z axis direction by controlling the table driving device 50. The system control unit 52 locates the imaging part of the object P near to the center of the magnetic field in the imaging space by controlling the position of the table 34 in the above manner.

In addition, the system control unit 52 functions as an imaging condition setting unit. That is, the system control unit 52 sets the imaging conditions of the main scan on the basis of some of the imaging conditions and information inputted to the input device 62 by a user. For the sake of achieving this, the system control unit 52 makes the display device 64 display screen information for setting the imaging conditions.

The input device 62 provides a user with a function to set imaging conditions and image processing conditions.

The aforementioned term "imaging condition" refers to under what condition an RF pulse or the like is transmitted in what type of pulse sequence, or under what condition MR signals are acquired from the object P, for example. As a parameter of the "imaging conditions", for example, there are "the imaging region as positional information in the imaging space", an imaging part, the type of the pulse sequence such as parallel imaging, the type of RF coil devices used for imaging, the number of slices, an interval between respective slices.

The above "imaging part" means a region of the object P to be imaged as an imaging region, such as a head, a chest and an abdomen.

The aforementioned "main scan" is a scan for imaging an intended diagnosis image such as a proton density weighted image, and it does not include a scan for acquiring MR signals for a scout image or a calibration scan.

A scan is an operation of acquiring MR signals, and it does not include image reconstruction processing.

The calibration scan is, for example, a scan for determining "unconfirmed elements of imaging conditions", "conditions and data used for image reconstruction processing" and so on, and it is performed separately from the main scan.

The after-mentioned "prescan" is a calibration scan which is performed before the main scan.

The image reconstruction unit 56 converts the raw data of MR signals inputted from the RF receiver 48 into, for example, matrix data on the basis of a phase encode step number and a frequency encode step number, and stores the converted data as k-space data. The k-space means a frequency space (Fourier space). The image reconstruction unit 56 generates image data of the object P by performing image reconstruction processing including such as two-dimensional Fourier transformation on the k-space data. The image reconstruction unit 56 stores the generated image data in the image database 58.

The image processing unit 60 takes in the image data from the image database 58, performs predetermined image processing on them, and stores the image data after the image processing in the storage device 66 as display image data.

The storage device 66 stores the display image data after adding "accompanying information such as the imaging conditions used for generating the display image data and information of the object P (patient information)" to the display image data.

The display device 64 displays a screen for setting imaging conditions of the main scan and images indicated by generated image data under control of the system control unit 52.

Figure 2:
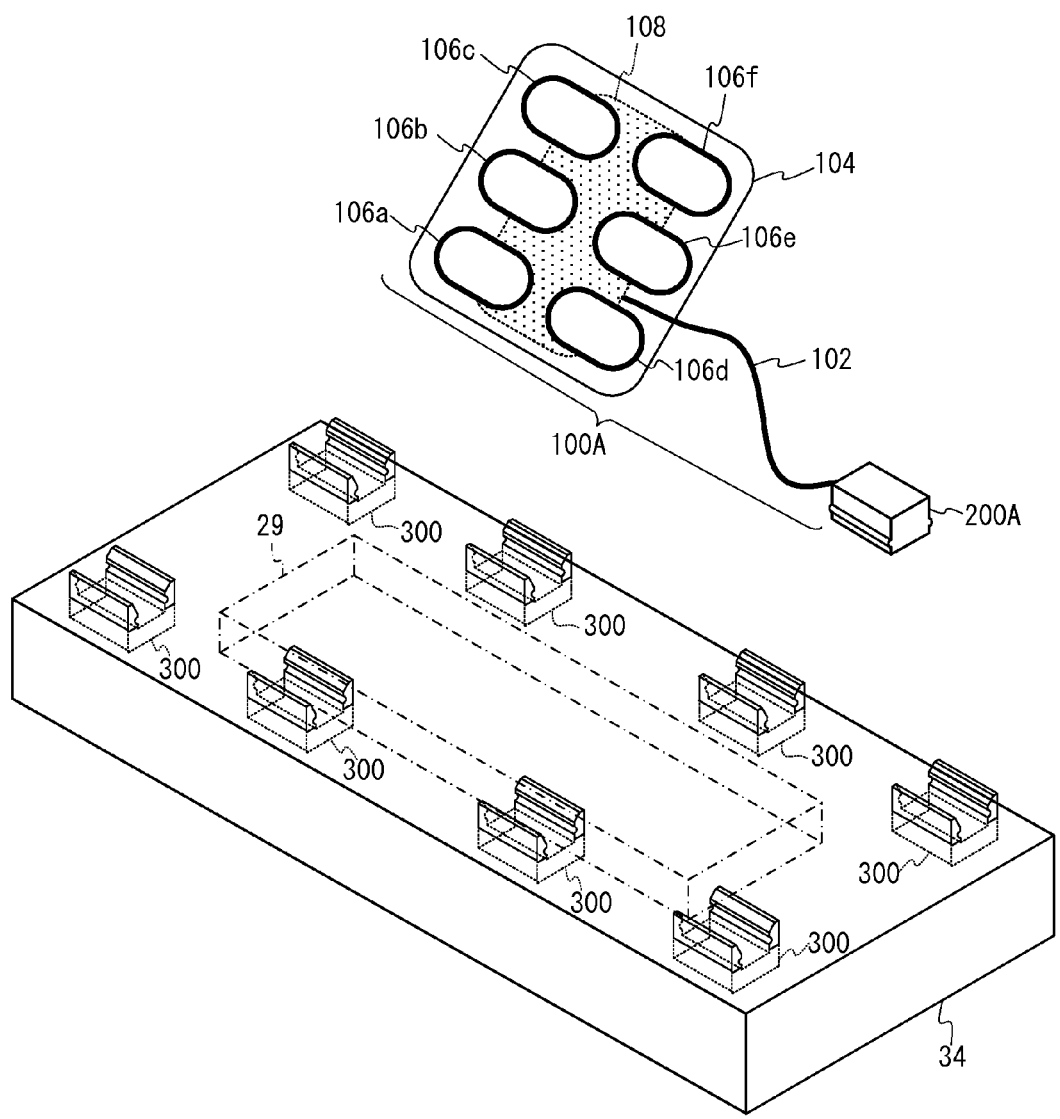
FIG. 2 is a schematic diagram showing an example of structure of an RF coil device and arrangement of control side radio communication devices.

FIG. 2 is a schematic diagram showing an example of the structure of the RF coil device 100A and an example of arrangement of the control side radio communication devices 300. As shown in FIG. 2, the RF coil device 100A includes the cable 102 and a cover member 104. The cover member 104 is made of a flexible material and is capable of deformation such as folding. As such a deformable (flexible) material, for example, a flexible circuit board (Flexible Printed Circuit FPC) described in Japanese Patent Application Laid-open (KOKAI) Publication No. 2007-229004 can be used.

Inside the cover member 104, a plurality of coil elements (surface coils) 106*a*, 106*b*, 106*d*, 106*d*, 106*e* and 106*f* functioning as antennas which respectively detect MR signals from the object P are disposed. Although six coil elements 106*a* to 106*f* are shown in FIG. 2 as an example here, the number or shape of the coil elements are not limited to the shown number or shape.

In addition, inside the cover member 104, a selection control unit 108 which controls the operation of the RF coil device 100A such as selection of the coil elements (106*a* to 106*f*) for detection is disposed. Although there are other components such as A/D (analog to digital) converter 140*a* inside the cover member 104, their details will be described later with FIG. 4.

As an example here, the coil side radio communication device 200A and the RF coil device 100A are assumed to be mutually separate components, but this is only an example of interpretation. The coil side radio communication device 200A may be interpreted as a part of the RF coil device 100A.

The cable 102 is connected to the coil side radio communication device 200A of the MRI apparatus 20A on its one end, and is connected to the selection control circuit 108 and so on inside the cover member 104 on its other end.

In addition, inside the cover member 104 of the RF coil device 100A, components such as preamplifiers PMPa to PMPf (see after-mentioned FIG. 4) for amplifying the MR signals detected by the coil elements 106*a* to 106*f* and bandpass filters for filtering may be disposed.

As an example here, eight of the control side radio communication devices 300 are arranged immediately beneath the surface of the table 34 on which the object P is loaded (hereinafter, this surface is referred to as the top surface of the table 34).

The object P is, for example, loaded in the middle of the width direction (the X axis direction in FIG. 1) of the table 34. Thus, in this example, on both end sides in the width direction of the table 34, four of the control side radio communication devices 300 are respectively arranged along the longer direction of the table 34 (the Z axis direction) in a row at intervals.

In addition, the chassis 302 (see after-described FIG. 3) of each of the control side radio communication devices 300 is embedded immediately beneath the top surface of the table 34, and its fixing plates 321 (see after-described FIG. 3) are exposed out of the top surface of the table 34. The coil side radio communication device 200A is detachably fixed to the control side radio communication device 300 by being interdigitated with the fixing plates 321.

Thus, no matter which part of the object P an RF coil device is set on, the coil side radio communication device 200A can be closely fixed to the nearest control side radio communication device 300. Although the present embodiment is an example of the RF coil device 100A for the chest part, this point applies to combination of an RF coil device for another part and the coil side radio communication device 200A. Therefore, the length of the cable 102 can be shortened.

Note that, the number or arrangement position of the control side radio communication devices 300 is not limited to that of FIG. 2 (inside the table 34). For example, the control side radio communication devices 300 may be disposed and exposed on the table 34 or on the gantry 21. Alternatively, the control side radio communication devices 300 may be disposed inside the gantry 21 or on the bed 32.

Figure 3:
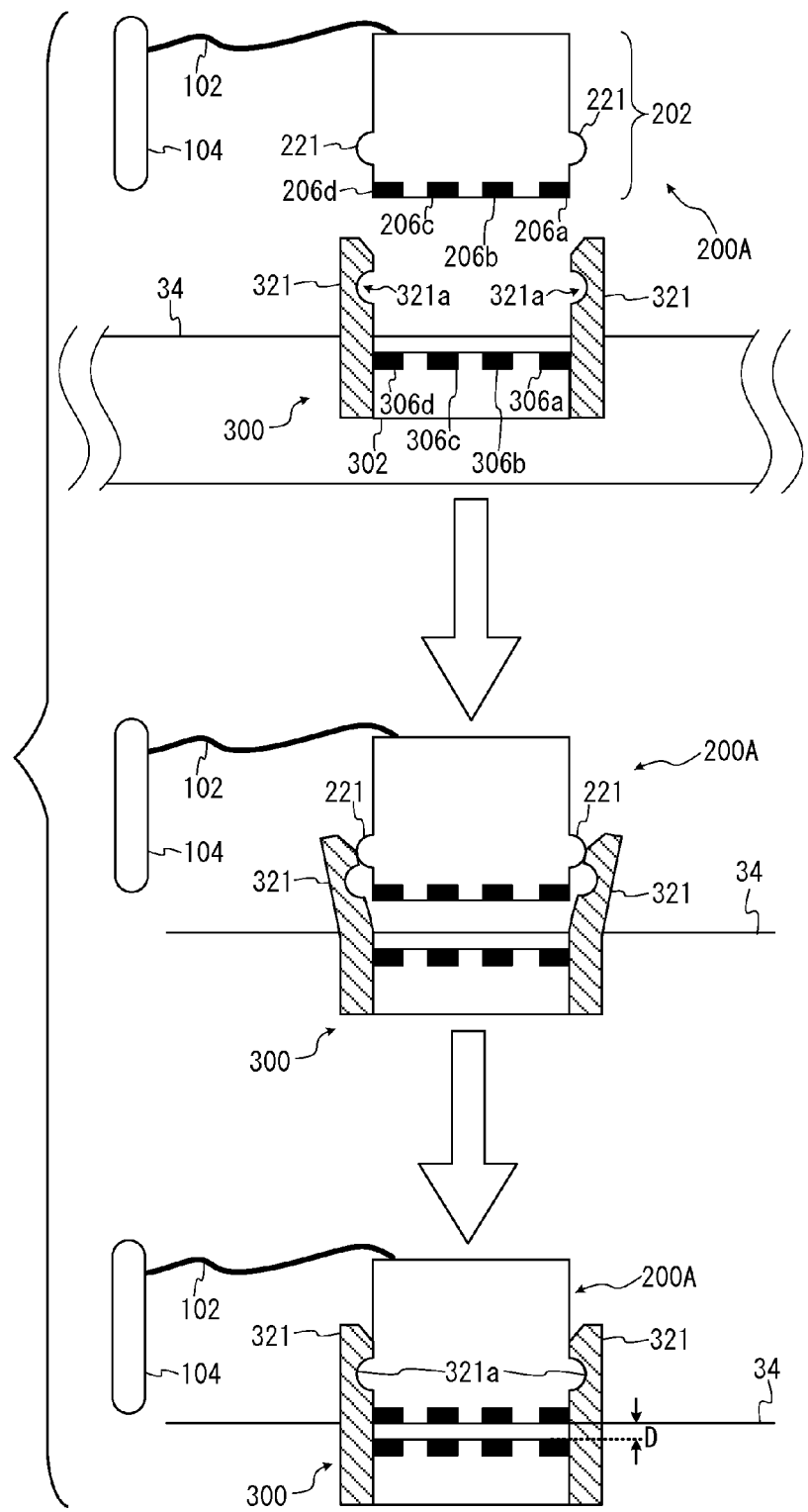
FIG. 3 is a schematic cross-sectional diagram showing an example of a method of fixing the coil side radio communication device to the control side radio communication device.

FIG. 3 is a schematic cross-sectional diagram showing an example of a method of fixing the coil side radio communication device 200A to the control side radio communication device 300.

As shown in the upper part of FIG. 3, for example, two bumps 221 are formed on the chassis 202 of the coil side radio communication device 200A.

In order to facilitate insertion and detachment of the coil side radio communication device 200A, each bump 221 is shaped in such a manner that its transverse section becomes a semicircle, for example. This is because smoothly chamfered surfaces of the bumps 221 make it easier to insert the coil side radio communication device 200A than bumpy surfaces thereof, in general. The bumps 221 may be spherical, for example. Alternatively, the bumps 221 may be in the form of a bisected cylinder divided along its axis direction.

As an example here, "the chassis 202 which includes the bump 221" is assumed to be made of undeformable nonmagnetic material. By forming it with nonmagnetic material, influence on the radio communication via an induced electric field can be unfailingly avoided.

The control side radio communication device 300 includes two fixing plates 321 fixed to ambilateral side surfaces of the chassis 302 by, for example, adhesive bonding.

Both fixing plates 321 are approximately in the form of a flat plate, for example, and disposed so as to face each other. As shown in the lower part of FIG. 3, each of the fixing plates 321 is shaped in the form of interdigitating the coil side radio communication device 200A. That is, "dent parts 321a in the form of interdigitating the bump 221" are respectively chamfered on "the mutually facing surfaces of the two fixing plates 321" at a position corresponding to each of the bumps 221 (see the upper part of FIG. 3).

In addition, the end side (the side opposite to the chassis 302) of each of the fixing plates 321 is chamfered aslant in order to ease insertion of the coil side radio communication device 200A. As to the fixing plates 321, it is preferable to form them with elastic material of nonmagnetic body which can be curved to a degree shown in the middle part of FIG. 3. As such material, for example, plastic and synthetic resin can be used. The reason for forming them with nonmagnetic material is the same as before.

The control side radio communication device 300 is embedded behind the top surface of the table 34 for the depth of interval D, for example (see the lower part of FIG. 3). The interval D is an interval capable of the radio communication via an induced electric field. On the top surface of the table 34, "ditches into which the fixing plates 321 can be inserted" are formed, and the fixing plates 321 stick out of the top surface of the table 34 via these ditches.

In the above structure, the coil side radio communication device 200A is inserted into the side of the control side radio communication device 300 from the state of the upper part of FIG. 3. At this insertion timing, as shown in the middle part of FIG. 3, each of the fixing plates 321 is bent in the direction of mutually separating. This is because the maximum width between both bumps 221 on the ambilateral side surfaces of the coil side radio communication device 200A is larger than the minimum width between both fixing plates 321.

Then, at the position where the basal plane of chassis 202 of the coil side radio communication device 200A has contact with the top surface of the table 34, both bumps 221 are respectively interdigitated with the dent parts 321a, and each of the fixing plates 321 returns to the original shape (shown in the upper part of FIG. 3 before insertion) by shape recovery force. Thereby, the coil side radio communication device 200A is detachably fixed to the control side radio communication device 300 on the table 34.

Here, the coil side radio communication device 200A includes antennas 206a to 206d on its bottom aspect side (the side of the control side radio communication devices 300 in the above fixed state). In addition, the control side radio communication device includes antennas 306a to 306d on its top surface side (the side of the coil side radio communication device 200A in the above fixed state).

Each of the antennas 306a to 306d corresponds to each of the above antennas 206a to 206d so as to group into a pair (totally, four pairs). Out of the antennas 206a to 206d and 306a to 306d, at least the antennas 206a and 306a are composed of, for example, later-described induced electric field combined couplers.

Under the state in which the coil side radio communication device 200A and the control side radio communication device 300 are closely fixed to each other as just described, the antennas 206a to 206d are respectively disposed at positions where they face the antennas 306a to 306d respectively. When imaging is finished, the coil side radio communication device 200A is taken out of the fixing plated 321 so as to separate from the table 34.

Note that, the above interdigitation is only an example of methods of fixing the coil side radio communication device 200A, and other detachable fixing methods may be alternatively used. For example, out of the male side and the female side of a hook-and-loop fastener, one side may be fixed to the top surface of the table 34 and the other side may be fixed to the bottom surface of the coil side radio communication device 200A. When the top surface of the control side radio communication device 300 is exposed out of the top surface of the table 34, one side of the male side or the female side of a hook-and-loop fastener may be fixed to the top surface of the control side radio communication device 300.

The radio communication via an induced electric field is performed on the pathway between the coil side radio communication device 200A and the control side radio communication device 300A. An induced electric field means an electric field caused by time change of magnetic flux density. As short-distance radio communication via an induced electric field, for example, "TransferJet (Trademark) which uses an induced electric field combined coupler as an antenna" can be used (see Japanese Patent Application Laid-open (KOKAI) Publication No. 2010-147922, for example).

More specifically, the induced electric field combined coupler includes a coupling electrode, a resonance stub, a ground and so on (not shown). If an electric signal is inputted to the resonance stub of the transmission side, electric charges are accumulated in the coupling electrode, and "virtual electric charges equal to the electric charges accumulated in the coupling electrode" are generated in the ground. Thereby, a micro electrical dipole is composed by these electric charges, and this micro electrical dipole functions as a transmission side antenna. That is, data are transmitted to the receiving side via an induced electric field of a longitudinal wave generated by the micro electrical dipole. Because a longitudinal wave vibrating in parallel with the traveling direction is not influenced by the direction of an antenna, stable data transmission can be achieved.

However, if the receiving side is separated from the transmission side beyond limit, both sides are not electromagnetically coupled and data transmission cannot be performed. This is because induced electric fields formed by the induced electric field combined couplers rapidly attenuate if the interval between both sides of the couplers becomes distant.

Although the antennas 206a to 206d are discretely disposed and the antennas 306a to 306d are discretely disposed in order to distinguish respective components in FIG. 3, interference between each of the four radio communication pathways can be avoided without arranging them separately.

More specifically, the four radio frequencies respectively used in the pathway of the antennas 206a to 306, the pathway of the antennas 206b to 306b, the pathway of the antennas 206c to 306c and the pathway of the antennas 206d to 306d may be separated (their frequency values may be widely set apart). As to the radio communication frequency, it is preferable to avoid frequencies which are equal to numbers obtained by dividing "a center frequency of RF pulses transmitted to the object P" by a natural number, in each of the radio communication pathway.

It is preferable that installation positions of the control side radio communication devices 300 are not too deep from the top surface of the table 34. If positions of the antennas 306a to 306d of each of the control side radio communication devices 300A in the table 34 are too deep, the interval D (see the bottom part of FIG. 3) between the transmission side and the receiving side cannot be close enough to electro-magnetically couple "the antennas 206a to 206d of the transmission side" to "the antennas 306a to 306d of the receiving side". In this case, the radio communication via an induced electric field will be difficult to be achieved.

That is, it is preferable to dispose each of the control side radio communication devices 300 to such a position that "each control side radio communication device 300 can be fixed to the coil side radio communication device 200A close enough to be electro-magnetically coupled to the coil side radio communication device 200A".

Note that, as long as "an electric dipole (antenna) of the coil side radio communication device 200A side" is not directly contacted to "an electric dipole (antenna) of the control side radio communication device 300 side", "the chassis covering the antennas of the coil side radio communication device 200A side" may be contacted to "the chassis covering the antennas of the control side radio communication device 300 side". This is because it is enough if the interval D causing an induced electric field is kept between the antennas of the transmission side and the antennas of the receiving side. Thus, the control side radio communication devices 300 may be exposed in such a manner that its surface of the antennas side becomes in line with the top surface of the table 34.

Figure 4:
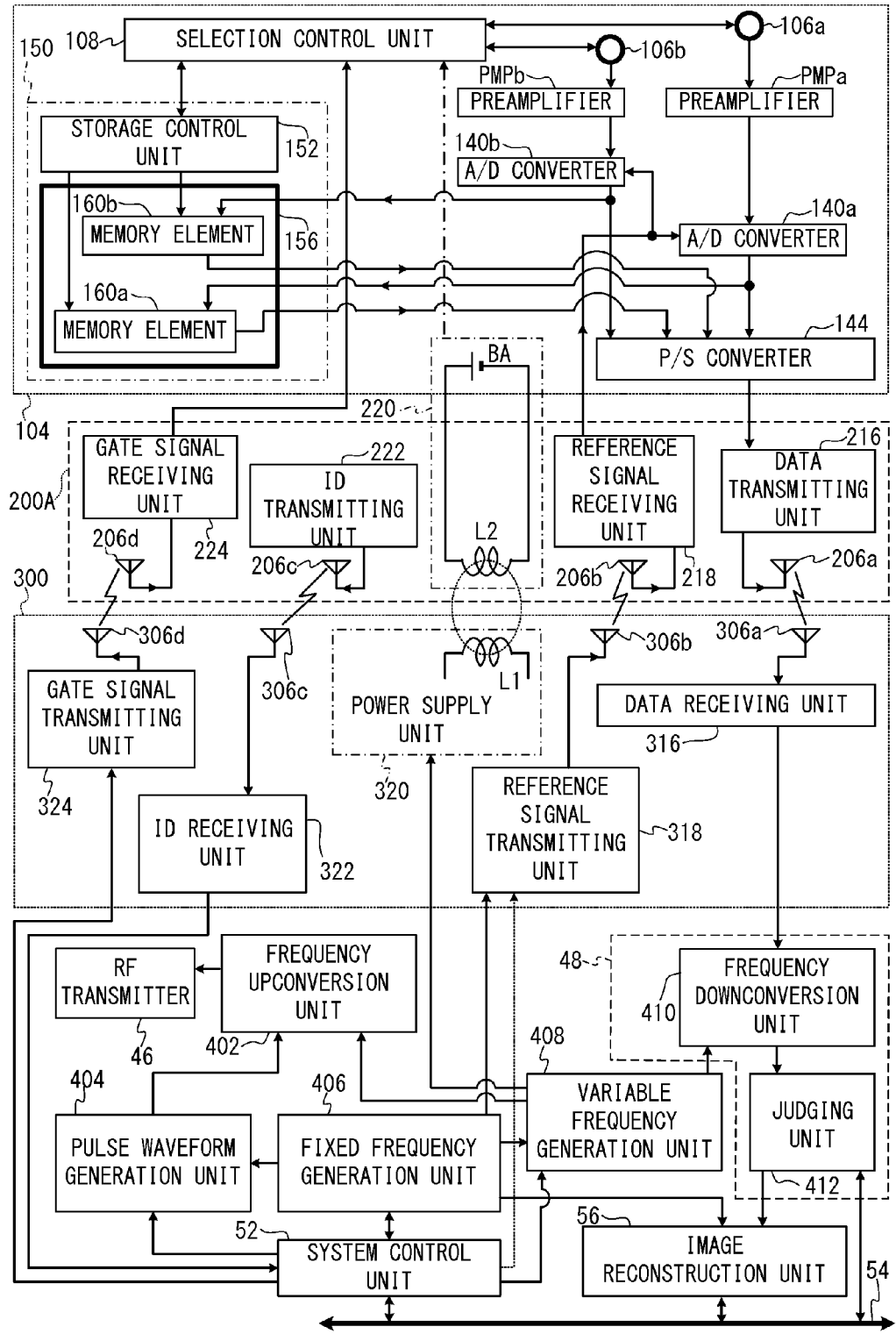
FIG. 4 is a schematic block diagram showing the functions of the respective units relevant to transmission of MR signals detected by coil elements of the RF coil device.

FIG. 4 is a schematic block diagram showing the functions of the respective units relevant to transmission of the MR signals detected by the coil elements 106a to 106f of the RF coil device 100A. In the following, each component will be explained from the top side of FIG. 4 in order. That is, each component will be explained in the order of (1) the cover member 104 of the RF coil device 100A, (2) the coil side radio communication device 200A, (3) the control side radio communication devices 300 and (4) the control side of the MRI apparatus 20A.

Firstly, inside the cover member 104, the aforementioned selection control unit 108, the aforementioned plurality of coil elements 106a to 106f, preamplifiers PMPa to PMPf, A/D converters 140a to 140f, a P/S (parallel/serial converter) 144, a rechargeable battery BA and a data saving unit (data backup unit) 150 are disposed. Note that, in order to avoid complication, the coil elements 106c to 106f, the preamplifiers PMPc to PMPf and the A/D converters 140c to 140f are not shown in FIG. 4.

The data saving unit 150 includes a storage control unit 152, an electric field shield 156, and memory elements 160a to 160f inside the electric field shield 156. Note that, in order to avoid complication, the memory elements 160c to 160f are not shown in FIG. 4. That is, in this example, the number of the memory elements (160a to 160f) is the same as the A/D converters (140a to 140f), the preamplifiers (PMPa to PMPf) and the coil elements (106a to 106f), respectively.

The A/D converters 140a to 140f respectively correspond to the preamplifiers PMPa to PMPf, the preamplifiers PMPa to PMPf respectively correspond to the coil elements 106a to 106f, and the memory elements 160a to 160f respectively correspond to the A/D converters 140a to 140f.

The MR signals respectively detected by the coil elements 106a to 106f are respectively amplified by the corresponding preamplifiers PMPa to PMPf, then respectively digitized by the corresponding the A/D converters 140a to 140f, and then respectively stored in the corresponding the memory elements 160a to 160f.

Each of the memory elements 160a to 160f backs up data of the MR signals wirelessly transmitted via an induced electric field from the coil side radio communication device 200A to the control side radio communication device 300. Therefore, if data of the MR signals are not normally transmitted from the coil side radio communication device 200A to the control side radio communication device 300, the stored data in the memory elements 160a to 160f are used.

Thus, as the maximum number of the memory elements (160a to 160f), the same number as the coil elements (106a to 106f) functioning as antennas is preferable. However, the number of the memory elements is not limited to the above aspect, and it may be one, for example. Alternatively, the number of the memory elements may be half of the coil elements so that each of the memory elements backs up data of the MR signals detected by two coil elements.

As the memory elements 160a to 160f, memory elements which are readable and rewritable in a nonmagnetic manner are preferable in order to avoid influence on transmission and reception of the MR signals. Thus, as the memory elements 160a to 160f, for example, semiconductor memory elements such as a flash memory and EEPROM (Electronically Erasable and Programmable Read Only Memory) can be used. As an example in the present embodiment, it is assumed that flash memories are used for the memory elements 160a to 160f.

However, as to the memory elements 160a to 160f, they are not limited to semiconductor memory elements. For example, an optical pickup device may be installed inside the data saving unit 150, so that storage and erasing of data are performed with laser onto a rewritable small-type optical disk. In this case, the electric field shield 156 may be omitted.

In addition, each of the memory elements 160a to 160f includes a connection port such as USB (Universal Serial Bus), for example, and detachably connectable with the data saving unit 150 via the connection port. In addition, each of the memory elements 160a to 160f is detachably connectable with the after-described data collecting unit 600 (see FIG. 10).

The electric field shield 156 is, for example, a chassis formed by use of metal which is nonmagnetic material and has superior electrical conductivity. As such metal, for example, brass and copper can be used. Note that, the electric field shield 156 may be formed by covering undeformable nonmagnetic body such as plastic with copper foil.

The storage control unit 152 controls operation of writing and erasing of data of the MR signals to each of the memory elements 160a to 160f.

Next, the coil side radio communication device 200A further includes a data transmitting unit 216, a reference signal receiving unit 218, an ID (Identification Information) transmitting unit 222, a gate signal receiving unit 224 and a coil L2, in addition to the aforementioned antennas 206a to 206d.

In FIG. 4, the hard-wiring between the gate signal receiving unit 224 and the selection control unit 108, the hard-wiring between the coil L2 and the rechargeable battery BA, the hard-wiring between the reference signal receiving unit 218 and each of the A/D converters 140a to 140f, and the hard-wiring between the P/S (parallel/serial converter) 144 and the data transmitting unit 216 are included in the cable 102 (see FIG. 2). In order to avoid complication, the cable 102 is not shown in FIG. 4.

In addition, the power receiving unit 220 is composed of the coil L2 inside the coil side radio communication device 200A and the rechargeable battery BA inside the cover member 104.

Next, the control side radio communication devices 300 further includes a data receiving unit 316, a reference signal transmitting unit 318, a power supply unit 320, an ID (Identification Information) receiving unit 322 and a gate signal transmitting unit 324, in addition to the aforementioned antennas 306a to 306d. In addition, the power supply unit 320 includes a coil L1.

Next, the control system of the MRI apparatus 20A further includes a frequency upconversion unit 402, a pulse waveform generation unit 404, a fixed frequency generation unit 406, a variable frequency generation unit 408, aside from the components shown in FIG. 1. In addition, the RF receiver 48 includes a frequency downconversion unit 410 and a judging unit 412.

As an example in the first embodiment, there are "a region where an induced magnetic field for charging is generated" and "four radio communication pathways" between the coil side radio communication device 200A and the control side radio communication device 300. In the following, the above region and pathways will be explained in order.

Consider a case where the coil L2 of the power receiving unit 220 is located in a position close enough to be electromagnetically coupled to the coil L1 of the power supply unit 320 (i.e. a case where the coil side radio communication device 200A is closely fixed to the control side radio communication device 300 like the lower part of FIG. 3). In this case, the power supply unit 320 supplies a primary current to the coil L1 so as to generate an induced magnetic field, and thereby electromotive force is caused in the coil L2. By this electromotive force, a secondary current flows the coil L2, and thereby the rechargeable battery BA is charged.

The power receiving unit 220 provides the electric power charged in the above manner to each component of the coil side radio communication device 200A and the RF coil device 100A via hard-wiring (not shown).

Here, as to the frequency of the primary current supplied to the coil L1, it is preferable to separate the frequency from each communication frequency used in the four radio communication pathways. This is so that signals in the four radio communication pathways between the antennas 206a to 206d and the antennas 306a to 306d are not interfered by the above primary current.

Note that, as a method of saving electric power of the RF coil device 100A, instead of the power receiving unit 220 and the power supply unit 320, another rechargeable battery may be embedded in the RF coil device 100A and this rechargeable battery may be charged during unused span of the RF coil device 100A. Alternatively, "another rechargeable battery charged during unused span of the RF coil device 100A" and "the above power receiving unit 220 and the power supply unit 320" may be used in combination.

Next, the four radio communication pathways will be explained. Although the radio communication via an induced electric field is performed at least in the pathway between the antennas 206a and 306a, it may be performed in the pathway between the antennas 206b and 306, or the pathway between the antennas 206d and 306d.

Firstly, in the pathway between the antennas 206c and 306c, the identification information of the RF coil device 100A is transmitted from the coil side radio communication device 200A to the control side radio communication device 300.

More specifically, for example, the above identification information is preliminarily stored in the ID transmitting unit 222. However, the identification information of the RF coil device 100A may be inputted from the selection control unit 108 into the ID transmitting unit 222 of the coil side radio communication device 200A via the cable 102.

If the antenna 306c of the ID receiving unit 322 gets close to the antenna 206c of the ID transmitting unit 222, the ID transmitting unit 222 operates on the basis of electric power wirelessly supplied from the ID receiving unit 322. That is, the ID transmitting unit 222 automatically transmits the identification information from the antenna 206c to the antenna 306c as a digital signal. This radio communication of the identification information may be performed in the same way as RFID (Radio Frequency Identification) typified by, for example, IC (Integrated Circuit) tag.

The ID receiving unit 322 inputs the identification information of the RF coil device 100A received by the antenna 306c to the system control unit 52. Thereby, the system control unit 52 recognizes information on which of various types of RF coil devices such as the chest part RF coil device and the shoulder RF coil device is(are) currently connected.

Secondly, in the pathway between the antennas 306d and 206d, a gate signal is continuously wirelessly transmitted from the gate signal transmitting unit 324 of the control side radio communication device 300 to the gate signal receiving unit 224 of the coil side radio communication device 200A during imaging.

Figure 6:
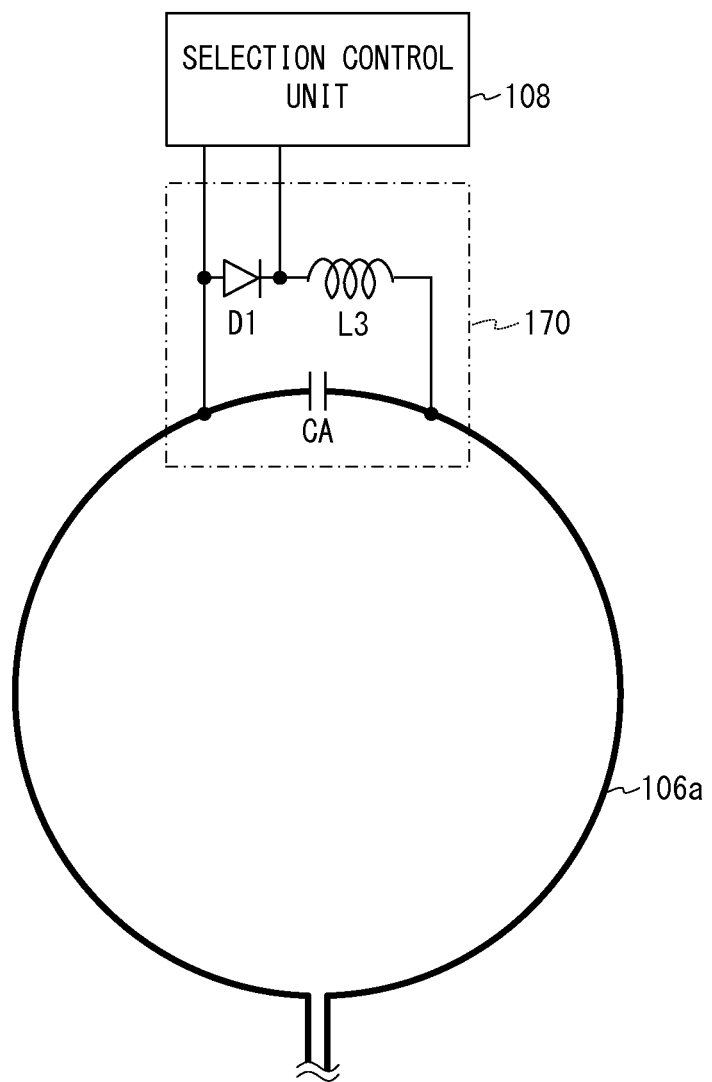
FIG. 6 is a schematic circuit diagram showing an example of judging whether or not it is in execution of a scan in the case of an active trap circuit.

More specifically, as a switch changing on/off state of each of the coil element 106a to 106f of the RF coil device 100A, for example, an active trap circuit 170 including a PIN diode (p-intrinsic-n Diode) and so on are used (see after-described FIG. 6). The gate signal is, for example, a signal stipulating the switching timing of impedance of the trap circuit (a control signal of the above switch).

Note that, as an alternative configuration, a trigger signal may be transmitted from the gate signal transmitting unit 324 to the gate signal receiving unit 224 and the gate signal is generated inside the gate signal receiving unit 224 on the basis of the trigger signal.

While RF pulses are transmitted to the object P, the gate signal inputted to the RF coil device 100A via the gate signal transmitting unit 324, the antenna 306d, the antenna 206d and the gate signal receiving unit 224 is generally set to on-level. During the on-level span of the gate signal, the above switch becomes off-state so as to disconnect the loop of each of the coil elements 106a to 106f and thereby each of the coil elements 106a to 106f cannot detect MR signals.

Except the span during which RF pulses are transmitted to the object P, the gate signal adjusted to off-level is wirelessly transmitted. While the gate signal is off-level, the above switch becomes on-state and each of the coil elements 106a to 106f can detect MR signals. The coupling effect between "the transmission RF coil 28 which transmits MR signals to the object P" and "the coil elements 106a to 106f which respectively detect MR signals from the object P" is prevented by the above on/off switching of the coil elements 106a to 106f.

Thirdly, in the pathway between the antennas 306b and 206b, a digital reference signal is transmitted from the reference signal transmitting unit 318 of the control side radio communication device 300 to the reference signal receiving unit 218 of the coil side radio communication device 200 at the start of a scan.

More specifically, the reference signal is a signal that synchronizes "the coil side radio communication device 200A as a transmission side of MR signals" with "a basic frequency of system on the basis of the fixed frequency generation unit 406". The reference signal transmitting unit 318 generates the reference signal by performing processing such as modulation, frequency conversion, amplification and filtering on the criteria clock signal inputted from the fixed frequency generation unit 406.

As an example in the first embodiment, the reference signal receiving unit 218 includes a crystal controlled oscillator that can generate a criteria clock signal of a constant frequency and so on, so that the reference signal receiving unit 218 can generate the criteria clock signal whose frequency is constant.

That is, the reference signal receiving unit 218 receives the reference signal only at a start time of a scan, and starts generation of the reference signal in accordance with the timing of initial rise and falling in the received reference signal. Note that, the later-described "trigger signal (A/D conversion start signal)" is superimposed on the reference signal received by the reference signal receiving unit 218 at a start time of a scan.

The reference signal receiving unit 218 continuously inputs the generated reference signal into each of the A/D converters 140a to 140f during implementation term of a scan. Thereby, the MR signals detected by the coil elements (106a to 106f) are normally subjected to A/D conversion and then backed up by the memory elements 160a to 160f, even if a communication failure occurs between the coil side radio communication device 200A and the control side radio communication devices 300.

However, the reference signal may not be generated inside the reference signal receiving unit 218. The reference signal may be continuously wirelessly transmitted from the reference signal transmitting unit 318 to the reference signal receiving unit 218 in the pathway between the antenna 306b and the antenna 206b.

The fixed frequency generation unit 406 generates the criteria clock signal whose frequency is constant. The fixed frequency generation unit 406 includes a crystal controlled oscillator with high degree of stability and so on, in order to generate the criteria clock signal.

The fixed frequency generation unit 406 inputs the criteria clock signal to the reference signal transmitting unit 318 and the variable frequency generation unit 408. In addition, the fixed frequency generation unit 406 inputs the criteria clock signal to respective components performing clock synchronization inside the MRI apparatus 20A such as the image reconstruction unit 56 and the pulse waveform generation unit 404.

The variable frequency generation unit 408 includes PLL (Phase-Locked Loop), DDS (Direct Digital Synthesizer), and a mixer. The variable frequency generation unit 408 operates on the basis of the above criteria clock signal. The variable frequency generation unit 408 generates a local signal (clock signal) of variable frequency that accords with a setting value inputted from the system control unit 52 as a center frequency of an RF pulse.

In order to achieve this, the system control unit 52 inputs a default value of the center frequency of the RF pulses to the variable frequency generation unit 408 before a prescan. In addition, the system control unit 52 inputs a corrected value of the center frequency of the RF pulses to the variable frequency generation unit 408 after the prescan.

The variable frequency generation unit 408 inputs the above local signal of variable frequency to the frequency downconversion unit 410 and the frequency upconversion unit 402.

In addition, "a trigger signal (A/D conversion start signal) that determines timing of sampling in the A/D converters 140a to 140f of the cover member 104" is inputted from the system control unit 52 to the reference signal transmitting unit 318. The above sampling means, for example, to extract intensity of an analog signal at regular time intervals so as to enable digital record.

As an example here, the reference signal transmitting unit 318 wirelessly transmits both the reference signal and the trigger signal to the reference signal receiving unit 218 only at a start timing of a scan, by superimposing trigger signal on the reference signal.

Fourthly, in the pathway between the antennas 206a and 306a, digitized MR signals are wirelessly transmitted from the data transmitting unit 216 of the coil side radio communication device 200A to the data receiving unit 316 of the control side radio communication device 300 via an induced electric field.

More specifically, the analogue MR signals detected by each coil element (at least one of 106a to 106f) selected for detection are respectively amplified by the corresponding preamplifier (one of PMPa to PMPf), then inputted to the corresponding A/D converter (one of 140a to 140f), and then converted into digital signals. At this time, the reference signal and trigger signal are inputted to each of the A/D converters 140a to 140f from the reference signal receiving unit 218. Thus, each of the A/D converters 140a to 140f starts sampling and quantization on the basis of the reference signal (sampling clock signal) in synchronization with the timing when the trigger signal is transmitted.

Each of the A/D converters 140a to 140f inputs the digitized MR signals to the corresponding memory element (one of 160a to 160f) and the P/S converter 144. That is, the A/D converter 140a inputs the MR signals which are detected by the coil element 106a, amplified by the preamplifier PMPa and digitized. Similarly, the A/D converter 140b inputs the MR signals which are detected by the coil element 106b, amplified by the preamplifier PMPb and digitized. The same applies to each of the A/D converters 140c to 140f.

However, if at least one of coil elements 106a to 106f is(are) not selected for detection, the preamplifier(s) (PMPa to PMPf) and the A/D converter(s) (140a to 140f) corresponding to the unselected coil element(s) do not operate as an example in this embodiment.

The P/S converter 144 converts the inputted single or plural MR signal(s) from parallel signals into a serial signal for radio transmission, and inputs the serial signal to the data transmitting unit 216 of the coil side radio communication device 200A via the cable 102. This is because the number of antenna for transmitting MR signals is only one (the antenna 206a) in the example of the first embodiment.

However, the present embodiment is not limited to the aspect of transmitting MR signals as a serial signal. For example, MR signals may be wirelessly transmitted as parallel signals by increasing the number of antennas for transmitting and receiving MR signals.

The data transmitting unit 216 generates MR signals for radio transmission (which are serial signals and digital signals) by performing processing such as error correction encoding, interleave, modulation, frequency conversion, amplification, and filtering on the inputted serial MR signals. The data transmitting unit 216 wirelessly transmits the MR signals for radio transmission from the antenna 206a to the antenna 306a.

The data receiving unit 316 performs processing such as amplification, frequency conversion, demodulation, deinterleave and error correction decoding on the serial MR signals received by the antenna 306a. Thereby, the data receiving unit 316 extracts the original digitized MR signals from the MR signals for radio transmission, and inputs the extracted MR signals to the frequency downconversion unit 410 of the RF receiver 48.

The frequency downconversion unit 410 multiplies the MR signals inputted from the data receiving unit 316 by the local signal inputted from the variable frequency generation unit 408, and makes an arbitrary signal band get through by filtering. Thereby, the frequency downconversion unit 410 performs frequency conversion (downconversion) on the MR signals, and inputs the MR signals whose frequency is lowered to the judging unit 412.

The judging unit 412 generates the raw data of the MR signals by performing predetermined signal processing on the above "MR signals whose frequency is lowered", and judges existence or non-existence of a transmission error on the basis of the raw data of the MR signals. The judging unit 412 specifies which part of the data corresponds to the transmission error (lack of data and so on), when it judges that a transmission error exists. As to the method of judging whether or not a transmission error exists and the method of specifying the part of data corresponding to a transmission error will be explained later with FIG. 5.

The judging unit 412 inputs the raw data of the MR signals to the image reconstruction unit 56. The image reconstruction unit 56 converts the raw data of the MR signals into k-space data and stores the k-space data as described earlier.

Note that, though the RF receiver 48 and the control side radio communication device 300 are explained as mutually separate components in the above configuration, this is only an example. For example, the RF receiver 48 may be a part of the control side radio communication device 300.

In addition, the data receiving unit 316 may perform "the judgment as to whether or not a transmission error exists" and "the identification of the part of data corresponding to a transmission error", instead of the judging unit 412 in the RF receiver 48, for example. Alternatively, "the judgment as to whether or not a transmission error exists" and "the identification of the part of data corresponding to a transmission error" may be performed in the image reconstruction unit 56.

The foregoing is an explanation of the four radio communication pathways.

In FIG. 4, the system control unit 52 determines the imaging conditions such as a repetition time (RF pulse cycle), a type of RF pulses, the center frequency of the RF pulses and a band width of the RF pulses in a pulse sequence, on the basis of the imaging conditions inputted by a user via the input device 62. The system control unit 52 inputs the imaging conditions determined in the above manner to the pulse waveform generation unit 404.

The pulse waveform generation unit 404 generates a pulse waveform signal of baseband by using the criteria clock signal inputted from the fixed frequency generation unit 406, depending on the imaging conditions inputted from the system control unit 52 in the above manner. The pulse waveform generation unit 404 inputs the pulse waveform signal of baseband to the frequency upconversion unit 402.

The frequency upconversion unit 402 multiplies the pulse waveform signal of baseband by the local signal inputted from the variable frequency generation unit 408, then makes an arbitrary signal band pass by filtering, and thereby performs frequency conversion (upconversion). The frequency upconversion unit 402 inputs the pulse waveform signal of baseband whose frequency is raised to the RF transmitter 46. The RF transmitter 46 generates the RF pulses on the basis of the inputted pulse waveform signal.

Figure 5:
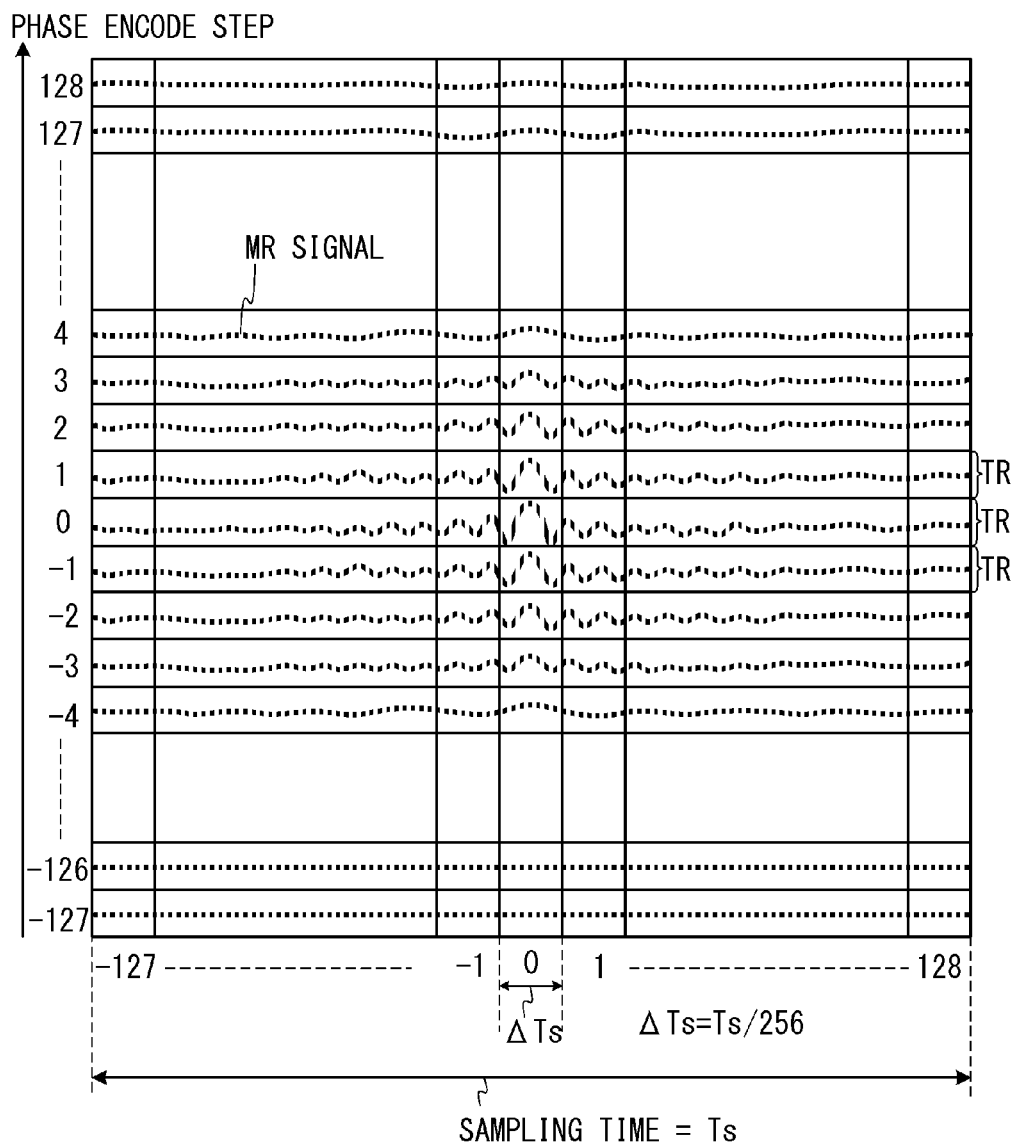
FIG. 5 is an explanatory diagram showing the data type of MR signals stored in memory elements.

FIG. 5 is an explanatory diagram showing the data type of MR signals stored in the memory elements 160a to 160f. In FIG. 5, the phase encode step number and the frequency encode step number are 256*256, but this is only an example. Each step number may be another number aside from 256. In FIG. 5, TR is a repetition time, Ts in the horizontal direction is a sampling time, and the longitudinal direction is the phase encode step.

In this case, for example, the phase encode is varied 256 times so as to acquire the MR signals of 256 lines for one image. More specifically, one line of the analogue MR signal detected by the coil element (106a to 106f) is amplified by the preamplifier (PMPa to PMPf). After this, a sine wave or a cosine wave of the carrier frequency is subtracted from the amplified one line of the analogue MR signal and then this MR signal is digitized in the A/D converter (140a to 140f). That is, one line (corresponding to one phase encode step) of the MR signal is converted into data which have many digital values discretely existing in the time axis direction within a sampling time. Each digital number indicates, for example, intensity of the MR signal at the corresponding receipt time.

Such digitized MR signals are stored in the memory elements 160a to 160f per line and inputted into the P/S converter 144 per line. The border between one line and the next line of the MR signal can be discriminated by the gate signal. That is, as an example in the present embodiment, each of the memory elements 160a to 160f backs up (stores) the MR signals as the above digital data of frequency space.

The judging unit 412 judges (determines) whether a transmission error is present or not in the following manner, after generating the raw data of the MR signals by performing predetermined signal processing on the digitized MR signals. For example, if data values corresponding to white noise are consecutive for a predetermined number, the judging unit 412 judges that a transmission error exists. In addition, if the same data values are successively-placed for a predetermined number, the judging unit 412 judges that a transmission error exists The judging unit 412 specifies (identifies) "a part in which data values corresponding to white noise are consecutive for a predetermined number" and "a part in which the same data values are successively-placed for a predetermined number" as faulty parts of transmission (an incomplete data part corresponding to a transmission error), for example.

In addition, the judging unit 412 specifies (identifies) "the line of which phase encode step of the MR signals detected by which of the coil elements 106a to 106f corresponds to the transmission error", for example.

In this case, a transmission error is judged per one line of the MR signals, and retransmission of the correct data corresponding to the faulty part of transmission is performed per one line, for example. However, this is only an example. Existence or non-existence of a transmission error may be judged per MR signals of one image and retransmission of the correct data corresponding to the faulty part may be performed per MR signals of one image. Alternatively, even if a transmission error is included only in one line, retransmission of the correct data of the MR signals may be performed per MR signals of a plurality of images.

As just described, though retransmitted data includes correct data corresponding to the faulty part, the retransmitted data may further include correct data which have been already successfully transmitted. Thus, to be exact, the above "retransmission of the correct data corresponding to the faulty part" means "to retransmit data that includes the correct data corresponding to the faulty part due to a transmission error".

In addition, though the radio communication pathway of the MR signals is only one between the antenna 206a and the antenna 306a in the first embodiment, existence or non-existence of a transmission error and identification of the faulty part of transmission are preferably performed per radio communication pathway in the case of a plurality of radio communication pathways of the MR signals.

For example, consider a case where the coil side radio communication device 200A of the RF coil device 100A for the chest part is closely fixed to one control side radio communication device 300 and the coil side radio communication device 200A of the RF coil device 100a for the lumber part is closely fixed to another control side radio communication devices 300. In this case, the judging unit 412 identifies which part of data corresponds to a transmission error per RF coil device (100A and 100α) and per coil element therein.

Note that, the respective lines of the MR signals inputted to the P/S converter 144 are wirelessly transmitted as described above, then arranged in the order of the phase encode step in the image reconstruction unit 56 like in FIG. 5, and finally converted into matrix data.

More specifically, (for example, representative or average) intensity of the MR signal is defined as a matrix value of each matrix element per "ΔTS obtained by evenly dividing 'the sampling time Ts of each MR signal corresponding to the horizontal direction in FIG. 5' by 256".

Thereby, matrix data consisting of 256 rows and 256 columns are respectively generated for the real number part (corresponding to the section from which the above cosine function is subtracted) and the imaginary number part (corresponding to the section from which the above sine function is subtracted). The image reconstruction unit 56 stores these two sets of matrix data as k-space data.

Here, as to backup of the MR signals by each of the memory elements 160a to 160f, "the judgment as to whether a scan is currently being performed or not" and "the judgment of a scan start timing" are important. In the following, some examples of the judgment methods will be explained with FIG. 6 to FIG. 8. The judgment as to "whether a scan is currently being performed or not" can be achieved (determined) by checking "whether an excitation RF pulse is transmitted or not".

FIG. 6 is a schematic circuit diagram showing an example of judging whether or not it is in execution of a scan in the case of the active trap circuit 170. Inside the cover member 104 of the RF coil device 100A, an active trap circuit 170 is disposed between the selection control unit 108 and the coil elements 106a.

The active trap circuit 170 includes a capacitor CA, a PIN diode D1 and a coil L3, and these elements are wired to the coil element 106a as described in FIG. 6.

The capacity of the capacitor CA, the inductance of the coil L3 and the resistance value of the PIN diode D1 in the forward direction are selected in such a manner that the resonance frequency of the loop circuit circulating the capacitor CA, the PIN diode D1 and the coil L3 becomes the Larmor frequency. In this case, the selection control unit 108 can judge "whether a scan is currently being performed or not" on the basis of the gate signal.

More specifically, if the coil element 106a is selected for detection, the selection control unit 108 applies the turn-on voltage to the PIN diode D1 in the forward direction while the gate signal inputted from the gate signal receiving unit 224 is on-level. Therefore, during the on-level span of the gate signal, the PIN diode D1 becomes the on-state (conduction state).

In addition, during the on-level span of the gate signal, the loop circuit circulating the capacitor CA, the PIN diode D1 and the coil L3 resonates at the Larmor frequency and becomes high impedance state, because excitation RF pulses of the Larmor frequency are transmitted to the object P. Thereby, the coil elements 106a cannot detect an MR signal because its electric current loop is blocked at the part of the capacitor CA.

Thus, when an on-span is included in the gate signal inputted from the gate signal receiving unit 224, the selection control unit 108 judges "that a scan is currently performed until a predetermined time span elapses starting from the on-span of the gate signal". The above predetermined time span is, for example, a period needed for acquisition of the MR signals and can be preliminarily determined on the basis of the imaging conditions such as a repetition time.

Note that, if the coil element 106a is not selected for detection, the selection control unit 108 continues to apply the turn-on voltage to the PIN diode D1 in the forward direction. Thereby, the coil element 106a cannot detect MR signals and accordingly the coupling effect between the coil element 106a and other coil elements (106b to 106f) selected for detection is prevented.

Figure 7:
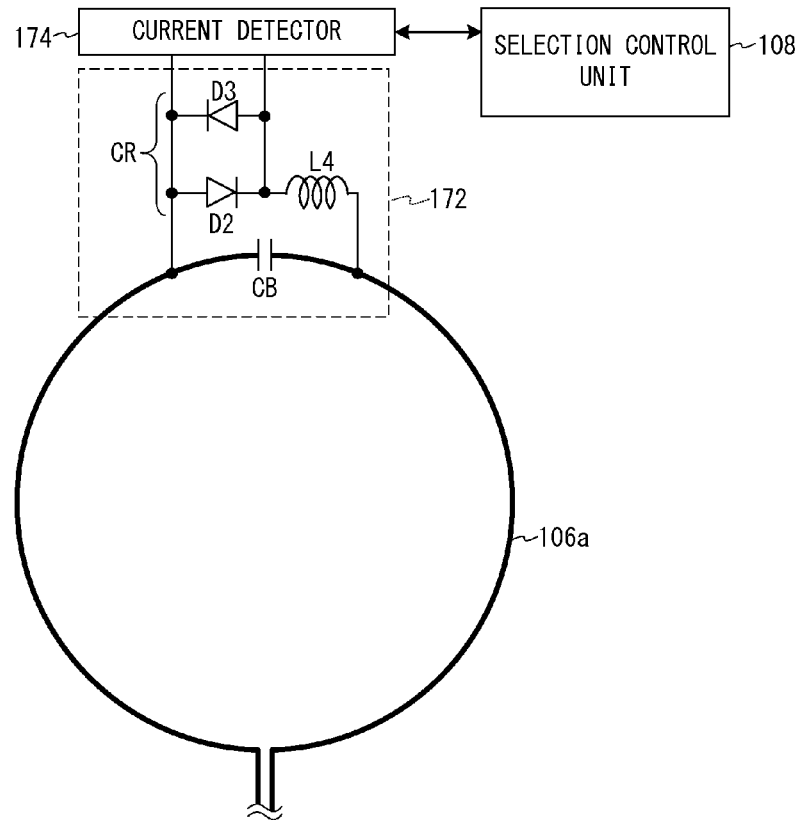
FIG. 7 is a schematic circuit diagram showing an example of judging whether or not it is in execution of a scan in the case of a passive trap circuit.

FIG. 7 is a schematic circuit diagram showing an example of judging whether or not it is in execution of a scan in the case of the passive trap circuit 172. The passive trap circuit 172 includes a coil L4, a capacitor CB and "diodes D2 and D3 parallely-connected as a cross diode CR", and these circuit elements are wired to the coil element 106a as shown in FIG. 7.

The capacity of the capacitor CB, the inductance of the coil L4 and the resistance values of the diodes D2 and D3 in the forward direction are selected in such a manner that the resonance frequency of the loop circuit circulating the coil L4, the capacitor CB and the cross diode CR becomes the Larmor frequency. The current detector 174 detects the electric current value flowing the cross diode CR, and inputs the detected value to the selection control unit 108.

In the following, the operation of the passive trap circuit 172 will be explained.

When an excitation RF pulse of the Larmor frequency is transmitted to the object P, an electric current momentarily flows the cross diode CR because the energy of an excitation RF pulse is large. Thereby, "the loop circuit of the coil L4, the capacitor CB and the cross diode CR" resonates and becomes a high impedance state. Therefore, the coil elements 106a cannot detect an MR signal because its electric current loop is blocked at the part of the capacitor CB.

Here, because the energy of the MR signals emitted from the object P due to nuclear magnetic resonance is far weaker than the energy of an excitation RF pulse, "an electric current which is large enough to apply turn-on voltage to each of the diodes D2 and D3" does not flow. Thus, during a span in which an excitation RF pulse is not transmitted, the passive trap circuit 172 becomes on-state (conduction state to a radiofrequency current via the part of the capacitor CB). That is, during the span in which an excitation RF pulse is not transmitted, the coil element 106a can detect an MR signal because its electric current loop is not blocked.

In addition, the acquisition of the MR signals is performed in accordance with the imaging conditions such as a repetition time for a certain period of time after transmission of an excitation RF pulse. Thus, the selection control unit 108 obtains the electric current value flowing the cross diode CR from the current detector 174 and judges "whether a scan is currently being performed or not" on the basis of the obtained electric current value.

That is, if the selection control unit 108 detects that an electric current equal to or larger than a predetermined value is flowing the cross diode CR, the selection control unit 108 judges "that a scan is currently performed until a predetermined time span elapses starting from this detection timing".

During a span in which an excitation RF pulse is transmitted, it is preferable to protect the coil element 106a by blocking the loop in the above manner, and a trap circuit (170, 172) of FIG. 6 and/or FIG. 7 is included in the present embodiment. Although the part of the coil element 106a is explained in FIG. 6 and FIG. 7, the structure of the trap circuits of other coil elements 106b to 106f is the same as FIG. 6 or FIG. 7.

Note that, in the case of the passive trap circuit 172, the selection control unit 108 may judge "whether a scan is currently being performed or not" on the basis of the applied voltage value of the cross diode CR, instead of the electric current value of the cross diode CR. In this case, a voltage detector is disposed instead of the current detector 174.

In the case of the above passive trap circuit 172, the coil elements 106a to 106f detect the MR signals regardless of whether they are selected for detection or not. In the case of the passive trap circuit 172, "only the MR signals detected by the coil elements (106a to 106f) selected for detection out of the coil elements 106a to 106f" are subjected to A/D conversion, stored and wirelessly transmitted as described earlier.

In the case of the passive trap circuit 172, though it has an advantage in that the control of switching between on-state and off-state is not necessary, the coupling effect between each of the coil elements 106a to 106f is not prevented like the active trap circuit 170 during the detection span of the MR signals. Thus, in order to prevent the coupling effect between each of the coil elements 106a to 106f, both of one active trap circuit 170 and one passive trap circuit 172 may be disposed for each of the coil elements 106a to 106f. In this case, control of the passive trap circuit 172 is not necessary, and the same control may be performed as to the active trap circuits 170 as described earlier.

Figure 8:
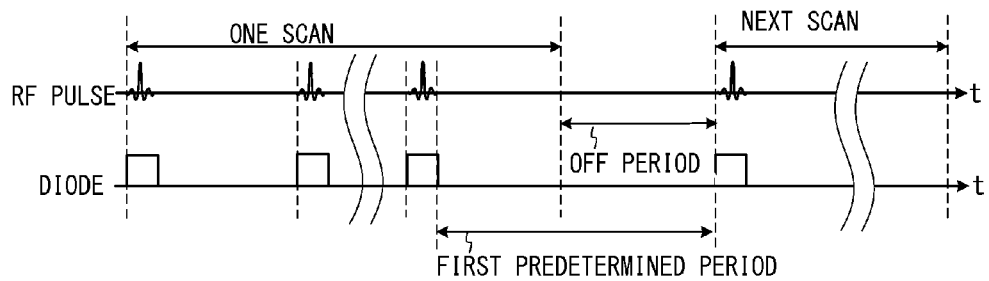
FIG. 8 is an explanatory diagram showing an example of judging the start timing of a scan on the basis of the transmission timing of an excitation RF pulse.

FIG. 8 is an explanatory diagram showing an example of judging the start timing of a scan on the basis of the transmission timing of an excitation RF pulse. In FIG. 8, the horizontal axis indicates elapsed time t from the start timing of a pulse sequence. The top part of FIG. 8 indicates transmission timing of a waveform of an excitation RF pulse, and the bottom part of FIG. 8 indicates voltage values of the PIN diode D1 of the active trap circuit 170.

As shown in FIG. 8, in the case of the active trap circuit 170, the PIN diode D1 becomes on-state and the voltage between both ends of the PIN diode D1 becomes the turn-on voltage during a span in which an excitation RF pulse is transmitted (during the on-span of the gate signal). Thus, if an off-span of the gate signal continues for "the first predetermined time span" and then the gate signal switches to on-level, the selection control unit 108 can judge that "the timing at which the gate signal is switched to on-level" is the start timing of the next scan. The above "first predetermined time span (see FIG. 8)" may be determined by the selection control unit 108 in accordance with the imaging conditions.

The storage control unit 152 acquires the start timing of the next scan from the selection control unit 108 on a real-time basis, and may erase data stored in the memory elements 160a to 160f in synchronization with the start timing of the next scan. This is because not acquisition of the MR signals but a prescan for determining reception gain are performed in the beginning of a scan in general. That is, data erasure is completed before digitizing and storing of the MR signals for image generation of the next scan, even if the data erasure is started immediately after the start timing of the next scan.

On the other hand, if the passive trap circuit 172 is used for each of the coil elements 106a to 106f as a trap circuit, the selection control unit 108 judges the start timing of a scan as follows. More specifically, the selection control unit 108 makes the current detector 174 detect the electric current value flowing the cross diode CR on a steady basis at regular time intervals.

If an electric current does not flow the cross diode CR for a time span equal to or longer than the second predetermined time span, the selection control unit 108 judges "the timing at which an electric current starts to flow the cross diode CR after this time span" as the start timing of the next scan. The above "second predetermined time span corresponds to "OFF PERIOD" in FIG. 8 and may be determined by the selection control unit 108 in accordance with the imaging conditions, for example.

If the start timing of a scan can be judged in the above manner, the selection control unit 108 can judge the finish time of a scan on the basis of the start timing of a scan and the imaging conditions such as a repetition time and slice number.

Next, an example of methods for collecting data manually in the case of a transmission error of data of the MR signals will be explained. As an example in the MRI apparatus 20A of the first embodiment, if a transmission error of the MR signals occurs, the data stored in the memory elements (160a to 160f) are used so that the correct data corresponding to a faulty part due to a transmission error are automatically retransmitted after completion of the main scan.

The judging unit 412 judges whether a transmission error is present in the retransmitted data or not. When the retransmission is not normally performed, the judging unit 412 identifies which part of data corresponds to the transmission error as well as this part is originally detected by which of the coil elements (106a to 106f), in the aforementioned manner. Then, the judging unit 412 inputs the identified results to the system control unit 52. The system control unit 52 makes the display device 64 display the memory element (at least one of 160a to 160f) corresponding to the coil element (at least one of 106a to 106f) whose detection data are judged as the incompletely transmitted data part.

Figures 9, 10:
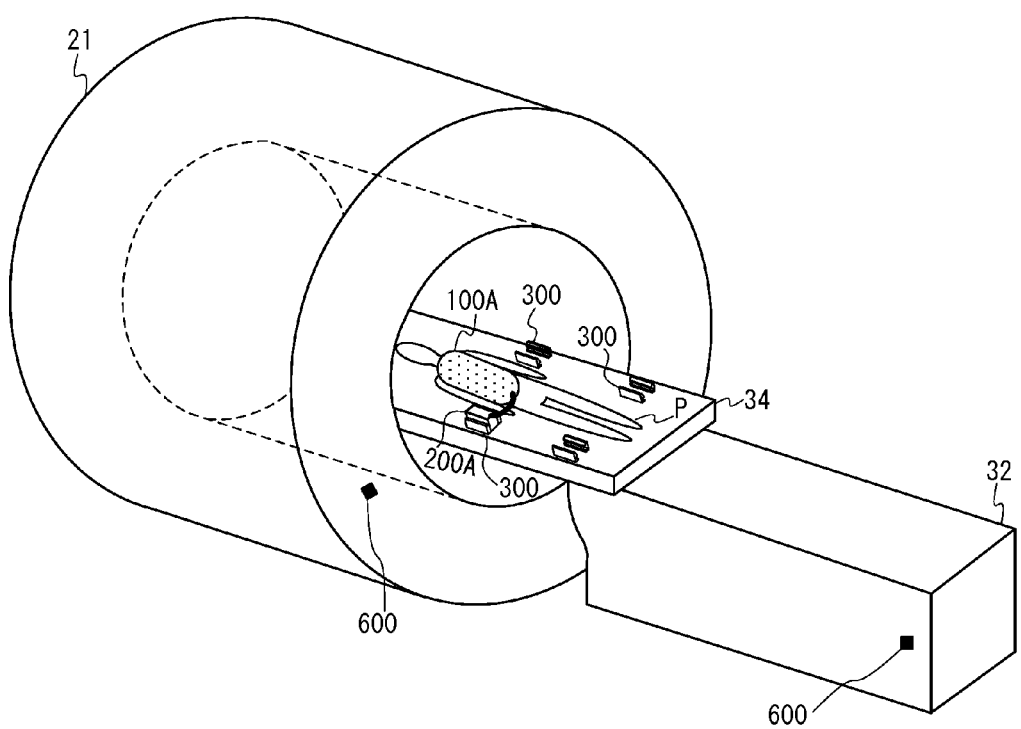
FIG. 9 is a schematic diagram showing an example of a guide display in methods of collecting data manually.
FIG. 10 is a schematic oblique drawing showing an example of arrangement of a data collecting unit.

FIG. 9 is a schematic diagram showing an example of a guide display in methods of collecting data manually. The system control unit 52 makes the display device 64 display the information which identifies the coil element (at least one of 106a to 106f) to be taken out. In the display example of FIG. 9, a transmission error is present in at least a part of data of the MR signals detected by the coil elements 106b and "a guide display prompting a user to take out the memory element 160b corresponding to the coil elements 106b and connect it to the after-described data collecting unit 600" is displayed.

Although each of the memory elements 160a to 160f is detachable as described earlier, it is preferable to make them visually mutually distinguishable by adding identification numbers on the surfaces of the respective memory elements 160a to 160f, for example.

When a plurality of the memory elements are included in the RF coil device 100A, it is preferable to display the information which identifies the coil element (at least one of 106a to 106f) to be taken out as described earlier.

On the other hand, when only one memory element included in the RF coil device 100A backs up the data detected by all of the coil elements 106a to 106f, a guide display is performed so as to prompt a user to take out the memory element and connect it to the data collecting unit 600.

FIG. 10 is a schematic oblique drawing showing an example of arrangement of the data collecting unit 600. In the example of FIG. 10, though the data collecting units 600 are emplaced at the entrance of the gantry 21 of the imaging room for one and at the bed 32 for one respectively, the number of the data collecting units 600 may be one, three, or more than three. In addition, the arrangement of the data collecting units 600 is not limited to the aspect shown in FIG. 10. For example, the data collecting unit 600 may be emplaced in the control room.

Each of the data collecting units 600 is connected to the RF receiver 48 by internal hard wiring, and includes the same type of connection port as the memory elements 160a to 160f.

Information which identifies the incomplete data part corresponding to a transmission error is inputted to each of the data collecting unit 600 from the system control unit 52 (or the judging unit 412). When the memory element (at least one of 160a to 160f) is connected to the data collecting unit(s) 600, each of the data collecting unit 600 obtains (reads in) the correct data corresponding to the incomplete data part from the connected memory element (at least one of 160a to 160f) on the basis of the inputted information, and inputs the obtained data to the RF receiver 48.

The correct data (corresponding to the faulty part due to a transmission error) obtained in the above manner are subjected to frequency downconversion in the frequency downconversion unit 410 and predetermined signal processing in the judging unit 412, and then inputted to the image reconstruction unit 56. The image reconstruction unit 56 compensates the incomplete data part corresponding to a transmission error, generates (corrects) k-space data on the basis of the compensated raw data of the MR signals, and stores the k-space data. Note that, regardless of which of the data collecting units 600 the memory element (at least one of 160a to 160f) is connected to, correct data of the MR signals are collected in the same manner.

In addition, in order to prevent a transmission error, the system control unit 52 makes each component of the MRI apparatus 20A perform acquisition of the identification information from the RF coil device 100A and thereby checks whether the connection between the coil side radio communication device 200A and the control side radio communication devices 300 is normal or not on a steady basis. The system control unit 52 outputs a warning command indicating that the connection status between the coil side radio communication device 200A and the control side radio communication devices 300 is changed to abnormal status, when the system control unit 52 fails to normally (successfully) acquire the identification information from the RF coil device 100A.

Figure 11:
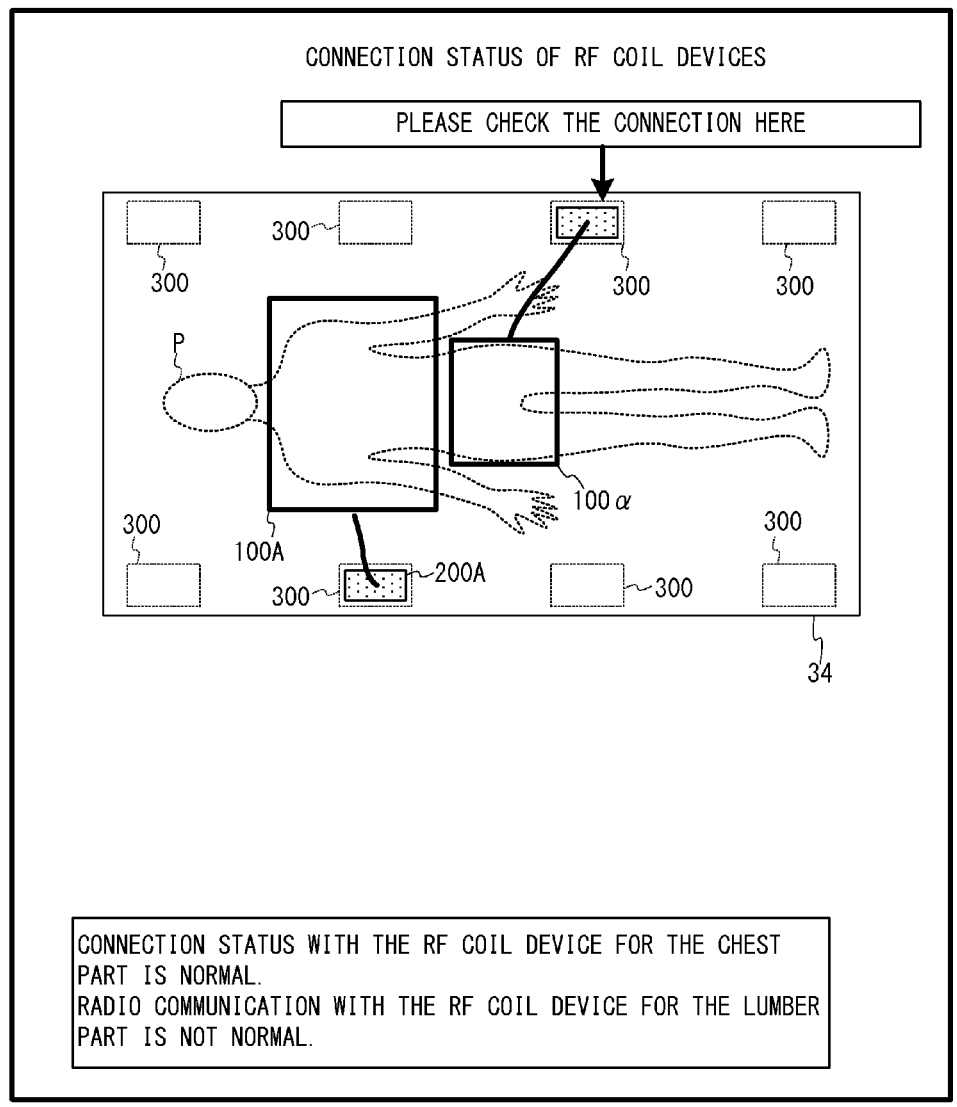
FIG. 11 is a schematic diagram showing an example of a warning display, when an RF coil device for the lumber part is used in addition to an RF coil device for the chest part and the radio communication status is not normal.

FIG. 11 is a schematic diagram showing an example of the warning display, when the RF coil device 100α for the lumber part is used in addition to the RF coil device 100A for the chest part and the radio communication status is not normal.

As an example in FIG. 11, the radio communication between the coil side radio communication device 200A of the RF coil device 100A for the chest part and one control side radio communication device 300 is normal, but the radio communication between the coil side radio communication device of the RF coil device 100a for the lumber part and another control side radio communication device 300 is not normal.

Thus, the system control unit 52 inputs the warning command to the display device 64, and makes the display device 64 display information on where the radio communication is not normally performed (i.e. radio communication between which of the RF coil devices and which of the control side radio communication devices 300 is not normal). This information is indicated by textual information at the bottom of the viewing surface with the arrangement diagram of the control side radio communication devices 300 in the table 34.

That is, the display device 64 functions as a notification unit notifying that radio communication is not normal, when the radio communication is not normal. Note that, notification of abnormally performed radio communication is not limited to display, but it may be performed, for example, by a warning sound. Alternatively, the notification of abnormally performed radio communication may be performed by emission of light such as blinking in red by arranging a light-emitting diode to an appropriate position.

Figure 12:
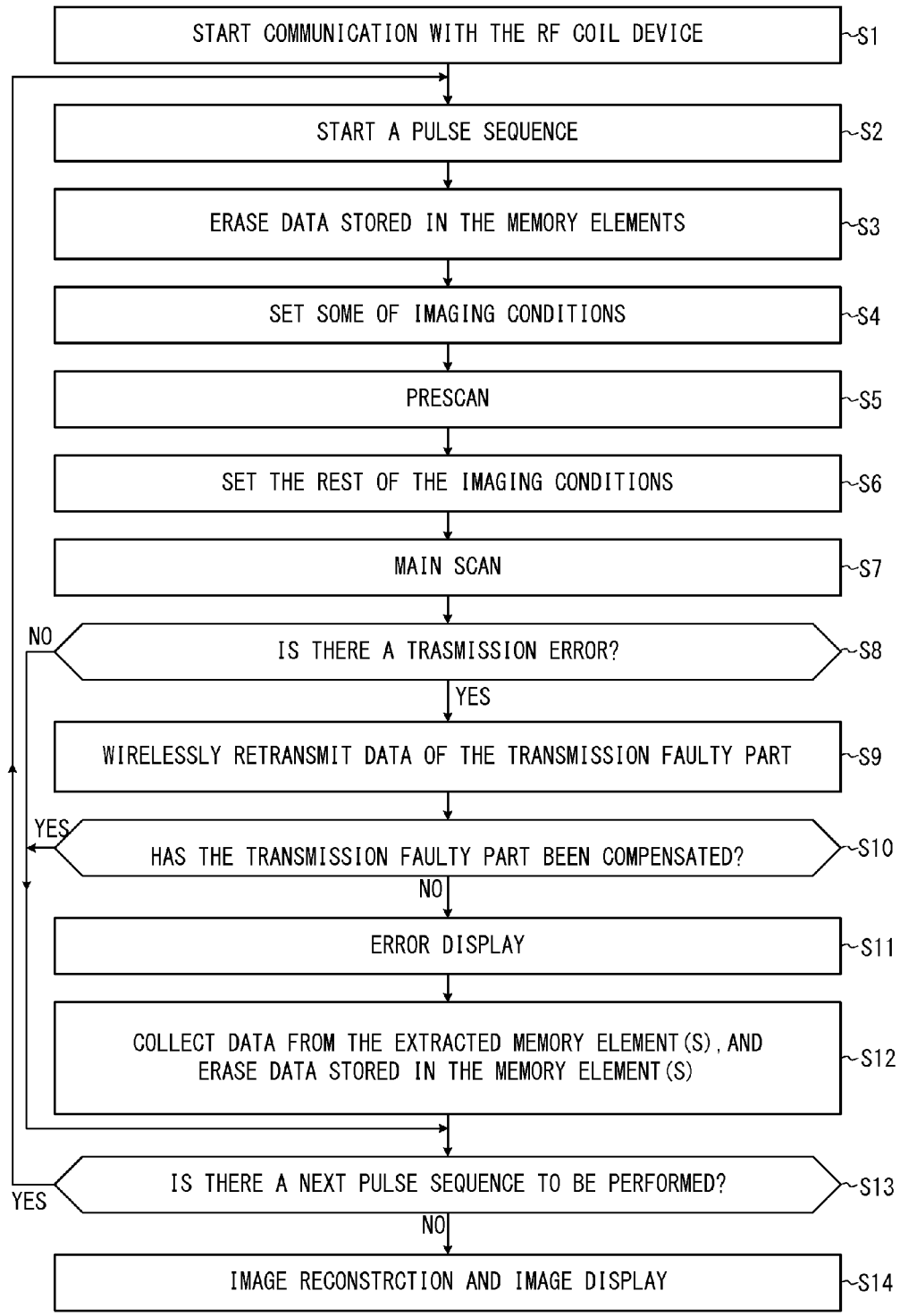
FIG. 12 is a flowchart illustrating an example of flow of the imaging operation performed by the MRI apparatus of the first embodiment.

FIG. 12 is a flowchart illustrating an example of flow of imaging operation performed by the MRI apparatus 20A of the first embodiment. In the following, in accordance with the step numbers in the flowchart shown in FIG. 12, an operation of the MRI apparatus 20A will be described by referring to the aforementioned FIG. 1 to FIG. 11 as required.

Note that, although a case of using the above RF coil device 100A will be explained as an example here, the same effects as the first embodiment can be obtained by disposing components similar to the coil side radio communication device 200A in other cases where other RF coil devices are used.

[Step S1] Under the state in which the table 34 is outside the gantry 21, the RF coil device 100A is set on the object P on the table 34, and the coil side radio communication device 200A is detachably closely fixed to the nearest control side radio communication device 300 (see FIG. 2 and FIG. 3).

If the coil side radio communication device 200A and the control side radio communication device 300 fall within the range capable of mutual communication by the above short-distance fixation, the aforementioned electric power supply and communication are started between both sides.

More specifically, the ID transmitting unit 222 wirelessly transmits the identification information of the RF coil device 100A to the ID receiving unit 322 by operating on the basis of electric power wirelessly transmitted from the ID receiving unit 322 (see FIG. 4).

Here, the antenna 306c of each the control side radio communication device 300 outputs electromagnetic waves at regular time intervals constantly while the table 34 is not inserted into the gantry 21. Therefore, when the coil side radio communication device 200A is fixed within the range capable of radio communication, wireless transmission of the identification information is immediately started.

The system control unit 52 acquires this identification information, and recognizes that the RF coil device 100A is currently connected. Thereby, the system control unit 52 gives (outputs) a permission of further communication between the coil side radio communication device 200A and the control side radio communication device 300, and makes the power supply unit 320 supply electric power to the power receiving unit 220.

Therefore, the power supply unit 320 and the power receiving unit 220 start electric power supply to each component of the coil side radio communication device 200A and each component of the RF coil device 100A, via an induced magnetic field as described earlier.

After this, the table driving device 50 moves the table 34 into inside of the gantry 21 in accordance with control of the system control unit 52.

In addition, the system control unit 52 makes each component of the MRI apparatus 20A continuously perform the processing of acquiring the identification information of the RF coil device 100A from the coil side radio communication device 200A at regular time interval until the completion of the pulse sequence. That is, the system control unit 52 checks the connection status between the coil side radio communication device 200A and the control side radio communication devices 300 on a steady basis. Then, the system control unit 52 outputs a caution command and makes the display device 64 display the caution (warning), when the identification information is not normally acquired (see FIG. 11). However, this processing is not performed during the implementation term of the processing of Step S11 and Step S12 in the case of taking out the memory element (at least one of 160a to 160f) with the table 34 returned outside the gantry 21. Thus, there is a possibility that the warning display is performed at an arbitrary timing from Step S1 to Step S10.

After this, the process proceeds to Step S2.

[Step S2] The system control unit 52 controls each component of the MRI apparatus 20A so as to become a standby state (ready state) for a pulse sequence. More specifically, the reference signal transmitting unit 318 inputs the digital reference signal to the reference signal receiving unit 218 by the radio communication pathway between the antenna 306b and the antenna 206b via, for example, an induced electric field, in accordance with the communication permission outputted from the system control unit 52. Note that, a trigger signal for determining the sampling timing is superimposed on the transmitted reference signal.

As an example here, the reference signal receiving unit 218 receives the reference signal only at the beginning of a scan, and then starts generation of the reference signal so as to match the timing such as initial rise and falling in the received reference signal. The reference signal receiving unit 218 continuously inputs the generated reference signal to each of the A/D converters (140a to 140f) until the completion of the main scan. Thereby, even if a transmission error occurs between the coil side radio communication device 200A and the control side radio communication device 300, the MR signals detected by the coil elements (106a to 106f) are amplified by the preamplifiers (PMPa to PMPf), then subjected to A/D conversion in the A/D converters (140a to 140f) and then stored in the memory elements (160a to 160f).

After this, the process proceeds to Step S3.

[Step S3] After the start of inputting the reference signal from the reference signal receiving unit 218 to each of the A/D converters (140a to 140f), the selection control unit 108 of the RF coil device 100A inputs a command of erasing data to the storage control unit 152. The storage control unit 152 starts erasure of all the data stored in all the memory elements 160a to 160f in synchronization with the timing of receiving the command of erasing data. Thereby, an area of use is completely eliminated in every memory element (160a to 160f), and the memory elements 160a to 160f can back up data at a maximum.

After this, the process proceeds to Step S4.

[Step S4] The system control unit 52 sets some of the imaging conditions of the main scan on the basis of "the imaging conditions inputted to the MRI apparatus 20A via the input device 62" and "information on the currently used RF coil device acquired in Step S1 (in this example, information indicating that the RF coil device 100A is used)".

After this, the process proceeds to Step S5.

[Step S5] The system control unit 52 makes the MRI apparatus 20A perform prescans by controlling each part of the MRI apparatus 20A. In the prescans, for example, a corrected value of the center frequency of the RF pulses is calculated, and a sensitivity distribution map of each of the coil elements 106a to 106f of the RF coil device 100A is generated.

After this, the process proceeds to Step S6.

[Step S6] The system control unit 52 sets the rest of the imaging conditions on the basis of the execution results of the prescans. The imaging conditions include information on which of the coil elements (at least one of 106a to 106f) are used for detection in the main scan.

Thus, the system control unit 52 inputs "the imaging conditions necessary for judging the star timing of a scan explained with FIG. 8" and "the information on the coil elements (at least one of 106a to 106f) used for the main scan" into the selection control unit 108 of the RF coil device 100A via any one of the radio communication pathways.

"The imaging conditions necessary for judging the star timing of a scan" and "the information on the coil element(s) used for detection" are, for example, wirelessly transmitted from the gate signal transmitting unit 324 to the gate signal receiving unit 224, and then inputted into the selection control unit 108 from the gate signal receiving unit 224.

After this, the process proceeds to Step S7.

[Step S7] The system control unit 52 makes the MRI apparatus 20A perform the main scan by controlling each component thereof.

More specifically, a static magnetic field is formed in the imaging space by the static magnetic field magnet 22 excited by the static magnetic field power supply 40. In addition, the electric current is supplied from the shim coil power supply 42 to the shim coil 24, and thereby the static magnetic field formed in the imaging space is uniformed.

Note that, the aforementioned gate signal is continuously transmitted between the antennas 306d and 206d from the gate signal transmitting unit 324 to the gate signal receiving unit 224 during implementation term of the main scan, if the switch of each of the coil elements 106a to 106f is the active trap circuit 170.

After this, when the system control unit 52 receives a command of start of imaging from the input device 62, the MR signals from the object P are acquired (collected) by repeating the following processes of <1> to <4> in series.

<1> The system control unit 52 drives the gradient magnetic field power supply 44, the RF transmitter 46 and the RF receiver 48 in accordance with the pulse sequence, thereby gradient magnetic fields are formed in the imaging region including the imaging part of the object P, and the RF pulses are transmitted from the transmission RF coil 28 to the object P.

Note that, if the switch of each of the coil elements 106a to 106f is the active trap circuit 170, the gate signal is set to, for example, on-level so as to set each of the coil elements 106a to 106f to off-state only during the transmission period of the RF pulses. Thereby, the aforementioned coupling effect is prevented.

<2> If the switch of each of the coil elements 106a to 106f is the active trap circuit 170, the gate signal is switched over to, for example, off-level after transmission of the RF pulses.

Then, each of the coil elements (at least one of 106a to 106f) selected by the selection control unit 108 detects the MR signals caused by nuclear magnetic resonance inside the object P.

The detected analog MR signals are inputted from each of the coil elements (106a to 106f) to each of the corresponding preamplifiers (PMPa to PMPf), amplified by each of the corresponding preamplifiers (PMPa to PMPf), and then inputted to each of the corresponding A/D converters (140a to 140f), respectively.

Note that, the preamplifiers (PMPa to PMPf) and the A/D converters (140a to 140f) respectively corresponding to the coil elements (106a to 106f) which are not selected in the Step S4 do not operate.

<3> Each of the A/D converters (140a to 140f) corresponding to the coil elements (106a to 106f) selected by the selection control unit 108 starts sampling and quantization of the MR signals inputted from the corresponding coil element, on the basis of the reference signal inputted from the reference signal receiving unit 218. Then, the A/D converters (140a to 140f) input the digitized MR signals to the P/S converter 144, respectively.

The P/S converter 144 converts the inputted plural MR signals into a serial signal, and inputs the serial signal to the data transmitting unit 216.

The data transmitting unit 216 generates MR signals for radio transmission by performing predetermined processing on the serial signal of the MR signals, and wirelessly transmits the serial signal from the antenna 206a to the antenna 306a via induced electric fields.

<4> The data receiving unit 316 extracts the original digital MR signals by performing predetermined processing on the serial signal for radio transmission received by the antenna 306a, and inputs the extracted MR signals to the frequency downconversion unit 410.

The frequency downconversion unit 410 performs frequency downconversion on the inputted MR signals, and inputs "the MR signals whose frequency is lowered" to the judging unit 412.

The judging unit 412 generates raw data of the MR signals by performing predetermined processing on the inputted MR signals.

The judging unit 412 judges whether at least a part of the generated raw data of the MR signals corresponds to a transmission error or not, in the aforementioned manner.

When the judging unit 412 judges that at least a part of the generated raw data corresponds to a transmission error, the judging unit 412 identifies "a part in which data values corresponding to white noise are consecutive for a predetermined number" and "a part in which the same data values are successively-placed for a predetermined number" as incomplete data parts (faulty parts of transmission), for example.

In this example, the judging unit 412 identifies "the line of which phase encode step of the MR signals detected by which of the coil elements 106a to 106f corresponds to the transmission error".

As to "the raw data of the MR signals which do not include an incomplete data corresponding to a transmission error", the judging unit 412 directly inputs such data to the image reconstruction unit 56 (without change). On the other hand, as to "the raw data of the MR signals which are incomplete and corresponds to a transmission error", such incomplete data are converted into substitution data by the judging unit 412 and the substitution data are inputted from the judging unit 412 to the image reconstruction unit 56, for example.

The substitution data are, for example, data whose values exclusively indicate the maximum luminance, and recognized as an incomplete data corresponding to a transmission error by the image reconstruction unit 56. The image reconstruction unit 56 converts the inputted raw data of the MR signals into k-space data and stores the k-space data.

The MR signals as the main scan are acquired by repeating the above <1> to <4> processes.

During implementation term of the main scan, as explained with FIG. 8, the start timing of the main scan is judged by the selection control unit 108. Then, the storage control unit 152 starts erasing the data stored in the memory elements 160a to 160f in synchronization with the start timing of the main scan, and the data erasure is completed before the start timing of storing data of the MR signals acquired in the main scan.

In addition, during implementation term of the main scan, the selection control unit 108 continuously judges whether the main scan is consecutively performed or not. As to this judging method, it is respectively explained by using FIG. 6 and FIG. 7 in the case of the active trap circuit 170 and in the case of the passive trap circuit 172.

During implementation term of the main scan, the selection control unit 108 controls the storage control unit 152 so as to make the storage control unit 152 back up data of the MR signals (which are before wireless transmission). That is, the MR signals digitized by the A/D converter (at least one of 140a to 140f) corresponding to the selected coil element are stored in the memory element (at least one of 160a to 160f) corresponding to this A/D converter. Thereby, data of all the MR signals detected by the selected coil element(s) are backed up.

After completing the above main scan and backup of data of the MR signals, the process proceeds to Step S8.

[Step S8] If a transmission error does not occur in the main scan in Step S7, the judging unit 412 inputs "the information indicating that a transmission error is not present" to the system control unit 52. In this case, the process proceeds to Step S13.

On the other hand, if a transmission error is present in the main scan in Step S7, the judging unit 412 inputs "the information indicating that a transmission error is present"

and "the information identifying the incomplete data part corresponding to the transmission error" to the system control unit 52. In this case, the process proceeds to Step S9.

[Step S9] The system control unit 52 transmits "the information identifying the incomplete data part corresponding to the transmission error" to the selection control unit 108 of the RF coil device 100A via any one of the radio communication pathways. For example, the system control unit 52 makes the gate signal transmitting unit 324 wirelessly transmit "the information identifying the incomplete data part corresponding to the transmission error" to the gate signal receiving unit 224. In this case, the gate signal receiving unit 224 inputs "the information identifying the incomplete data part corresponding to the transmission error" to the selection control unit 108.

The selection control unit 108 controls the storage control unit 152 so that "the correct data corresponding to the faulty part due to the transmission error" are inputted from the memory element (at least one of 160*a* to 160*f*) storing these correct data to the P/S converter 144. After this, the correct data corresponding to the transmission error are wirelessly retransmitted via an induced electric field in the aforementioned manner, subjected to frequency downconversion processing, and then inputted to the judging unit 412.

As described earlier, the retransmitted data may include not only "the correct data corresponding to the faulty part due to the transmission error" but also "previously normally transmitted data around the faulty part".

After this, the process proceeds to Step S10.

[Step S10] The judging unit 412 generates the raw data of the MR signals by performing a predetermined signal processing on the data of the MR signals inputted in Step S9, and judges whether or not these data includes incomplete data part (whether or not these data correspond to a transmission error), in the aforementioned manner. The judging unit 412 inputs the judgment result to the system control unit 52.

If the retransmitted data do not correspond to a transmission error, the judging unit 412 inputs the raw data of the MR signals generated in this Step S10 to the image reconstruction unit 56. Then, the image reconstruction unit 56 substitutes the data inputted in this Step S10 for the aforementioned substitution data so as to compensate the incomplete data corresponding to the transmission error. The image reconstruction unit corrects the k-space data on the basis of the compensated raw data of the MR signals in this manner, and stores the corrected k-space data. After this, the process proceeds to Step S13.

On the other hand, if the retransmitted data correspond to a transmission error, the system control unit 52 (or the judging unit 412) inputs "the information identifying the incomplete data part corresponding to the transmission error" to each of the data collecting units 600. After this, the process proceeds to Step S11.

[Step S11] The system control unit 52 makes the display device 64 perform the guide display of "the information on the memory element (at least one of 160*a* to 160*f*) to be taken out" (see FIG. 9).

The above "memory element to be taken out" means the memory element which stores the correct data which are unsuccessfully transmitted and correspond to a transmission error. In addition, the table driving device 50 moves the table 34 to outside of the gantry 21 in order for the memory element to be taken out in accordance with the control of the system control unit 52. In addition, the system control unit 52 makes each component of the MRI apparatus 20A stop the acquisition processing of the identification information from the RF coil device 100A. After this, the process proceeds to Step S12.

[Step S12] The memory element (at least one of 160*a* to 160*f*) identified by the guide display in Step S11 is manually detached from the RF coil device 100A by an operator, and the detached memory element is connected to the data collecting unit 600. When the memory element (at least one of 160*a* to 160*f*) is connected thereto, the data collecting unit 600 reads in the correct data corresponding to the part of a transmission error from the connected memory element and inputs (transfers) these data to the RF receiver 48. The data collecting unit 600 erases all the data stored in the connected memory element (at least one of 160*a* to 160*f*) after transferring the correct data corresponding to the transmission error.

The correct data corresponding to the transmission error are subjected to frequency downconversion processing, then subjected to predetermined signal processing in the judging unit 412, and then inputted to the image reconstruction unit 56. The image reconstruction unit 56 substitutes the data inputted in this Step S12 for the aforementioned substitution data so as to compensate the incomplete data corresponding to the transmission error. The image reconstruction unit corrects the k-space data and stores the corrected k-space data in the way similar to Step S10. After this, the process proceeds to Step S13.

[Step S13] If there is not a next pulse sequence to be performed for the same the object P, the system control unit 52 makes the MRI apparatus 20A proceed to Step S14.

On the other hand, if there is a next pulse sequence to be performed for the same the object P, the system control unit 52 makes the MRI apparatus 20A return to Step S2 by performing different processing for the following two cases respectively.

Firstly, when the processing of Step S11 and Step S12 is not performed, the system control unit makes the MRI apparatus 20A return to Step S2 under the state in which the processing of acquiring the identification information from the RF coil device 100A is continuously performed.

Secondly, when the processing of Step S11 and Step S12 is performed, the system control unit 52 makes the display device 64 display "information prompting an operator to reconnect 'the memory element connected to the data collecting unit 600' to a predetermined position of the RF coil device 100A". After this, if the memory element is normally reconnected in the data saving unit 150, the selection control unit 108 of the RF coil device 100A makes the ID transmitting unit 222 restart transmission of the identification information, and the system control unit 52 restart the processing of acquiring the identification information from the RF coil device 100A. After this, the table driving device 50 moves the table 34 to inside of the gantry 21 in accordance with control of the system control unit 52. After this, the process returns to Step S2.

[Step S14] The image reconstruction unit 56 reconstructs image data by performing image reconstruction processing including Fourier transformation on the k-space data. The image reconstruction unit 56 stores the reconstructed image data in the image database 58.

After this, the image processing unit 60 obtains the image data from the image database 58 and generates display image data by performing predetermined image processing on the obtained image data. The image processing unit 60 stores the display image data in the storage device 66. Then, the system control unit 52 transmits the display image data to the display device 64, and makes the display device 64 display images indicated by the display image data.

After completion of imaging, the table 34 is moved to outside of the gantry 21 and then the coil side radio communication device 200A is detached from the control side radio communication device 300. When both of them are moved beyond the range capable of radio communication, the radio communication and electric power supply between both sides are concluded.

The foregoing is a description of the operation of the MRI apparatus 20A according to the first embodiment. In the following, the effects of the first embodiment will be explained.

As just described in the first embodiment, the transmission side and the receiving side are closely fixed to each other in time of radio communication, and the radio communication via an induced electric field is performed. Therefore, because output power of radio communication can be more lowered than digital radio communication of conventional technology, the MRI apparatus 20A of the present embodiment easily accommodates to legal regulations in various countries.

In addition to the mutually closely-situated transmission side and receiving side, output power of radio communication can be lowered. Therefore, "the problem that the transmitted radio waves are reflected off surrounding areas and this degrades own data of radio communication" does not occur. Thus, digitized MR signals can be wirelessly transmitted satisfactorily from the RF coil device 100A side to the control side of the MRI apparatus 20A (the RF receiver 48 side).

In addition, a plurality of the MR signals respectively detected by the plurality of the coil elements (106*a* to 106*f*) are converted into a serial signal and then wirelessly transmitted. Thus, the necessary number of an antenna for transmitting the MR signals (radio communication pathway) is only one pair, and frequency separation for preventing interference is not necessary between each of the MR signals.

On the other hand, in the digital radio communication of conventional technology, the receiving side is located far away from the transmission side. Thus, in the digital radio communication of conventional technology, frequency separation and time-multiplexed communication are performed, because interference such as cross talk occurs if a plurality of coil elements for receiving MR signals are simultaneously connected. In a short-distance radio communication like the present embodiment, it is not necessary to perform time-multiplexed communication.

In addition, the control side radio communication devices 300 are respectively disposed to mutually separated positions, and it is enough to fix the coil side radio communication device 200A to any one of the control side radio communication devices 300. Thus, no matter which part of the object P an RF coil device is set on (i.e. no matter where the RF coil device 100A is located on the table 34), the coil side radio communication device 200A and the control side radio communication device 300 can be closely fixed to each other and the MR signals can be wirelessly transmitted satisfactorily.

In addition, because the electric power supply to the RF coil device 100A, the transmission of the gate signal and the transmission of the trigger signal are wirelessly performed, configuration of the MRI apparatus 20A can be simplified. As a result, cost of manufacturing the MRI apparatus 20A can be reduced.

Moreover, the MR signals detected by the coil elements (at least one of 106*a* to 106*f*) selected for detection inside the RF coil device 100A are respectively stored in the corresponding memory elements (one of 160*a* to 160*f*). Then, if a transmission error is present in data of the MR signals, the faulty data part corresponding to the transmission error is identified by the judging unit 412 and the correct data corresponding to the transmission error are automatically wirelessly retransmitted. Thus, according to the configuration of the MRI apparatus 20A, it is easy to compensate a faulty data part of MR signals corresponding to a transmission error.

In addition, even if the faulty data part corresponding to the transmission error is not compensated by the above wireless retransmission of the correct data corresponding to the transmission error, the identification information of the memory element which stores the correct data corresponding to the transmission error is displayed as a guide display. Thus, a faulty data part corresponding to a transmission error can be compensated only by detaching the corresponding memory element from the RF coil device 100A and connecting it to the data collecting unit 600.

In addition, the system control unit 52 checks the connection status of the coil side radio communication device 200A on a steady basis. Thereby, the system control unit 52 makes the display device 64 perform a warning display when the system control unit 52 fails to normally acquire the identification information of the RF coil device 100A (see explanation of Step S1 and FIG. 11). Thus, the system control unit 52 can prevent the MRI apparatus 20A from performing the main scan under the state of abnormal connection (i.e. causing a transmission error of data of the MR signals).

In addition, because the memory elements 160*a* to 160*f* are disposed inside the electric field shield 156, they are not subject to electromagnetic influence such as a static magnetic field and a gradient magnetic field and thus they can infallibly back up data of the MR signals.

In addition, the memory elements 160*a* to 160*f* store and erase data electrically. Therefore, reading and writing onto the memory elements 160*a* to 160*f* do not influence magnetic resonance imaging.

In addition, the respective memory elements 160*a* to 160*f* are configured to be detachable, and the data collecting unit 600 for manually connecting the memory element (160*a* to 160*f*) and collecting data backed up in the connected memory element is disposed. Thus, even if a extraordinary situation such as power stoppage happens, the data of the MR signals detected and backed up before the extraordinary situation can be infallibly collected.

In addition, the memory elements 160*a* to 160*f* respectively corresponding to the coil elements 106*a* to 106*f* are disposed, each of the memory elements (160*a* to 160*f*) stores data detected by the corresponding coil element (one of 106*a* to 106*f*) only. Then, in time of manual collection of data due to a transmission error, information on which of the memory elements (160*a* to 160*f*) should be taken out is displayed as a guide (Step S11 and FIG. 9). Thus, operation manual collection of data is easy.

In addition, the selection control unit 108 judges the start timing of the main scan by the gate signal in the case of the active trap circuit 170, and the selection control unit 108 judges the start timing of the main scan by an electric current value in the cross diode CR in the case of the passive trap circuit 172. Thus, the selection control unit 108 can accurately judge the start timing of the main scan. In synchronization with the start timing of the main scan accurately judged in this manner, all the data stored in the memory elements 160*a* to 160*f* are erased in one lump. Thus, sufficient storage areas of data of the MR signals to be newly acquired can be kept at an appropriate timing.

In addition, the selection control unit 108 and the storage control unit 152 make the memory elements 160*a* to 160*f* back up data of the MR signals during implementation term of the main scan. Thus, the backup processing of data of the MR signals never prolongs a scan time.

In addition, the selection control unit 108 judges "whether the main scan is consecutively performed or not", on the basis of the gate signal in the case of the active trap circuit 170. Also, the selection control unit 108 judges "whether the main scan is consecutively performed or not", on the basis of an electric current value in the cross diode CR in the case of the passive trap circuit 172. Thus, because the selection control unit 108 can immediately judge the completion (timing) of the main scan at the finish time of the main scan, it is easy to determine the completion timing of the backup processing of data of the MR signal.

According to the aforementioned embodiment, digitized MR signals can be wirelessly transmitted from an RF coil device to an MRI apparatus satisfactorily, in MRI. In addition, a transmission error of data of MR signals caused by communication disturbance can be compensated.

The Second Embodiment

Next, the MRI apparatus 20B of the second embodiment will be explained. Note that, the MRI apparatuses 20B of the second embodiment differs only in "the method of collecting data of the MR signals which are backed up" from the first embodiment. Thus, only different points will be explained.

Figure 13:
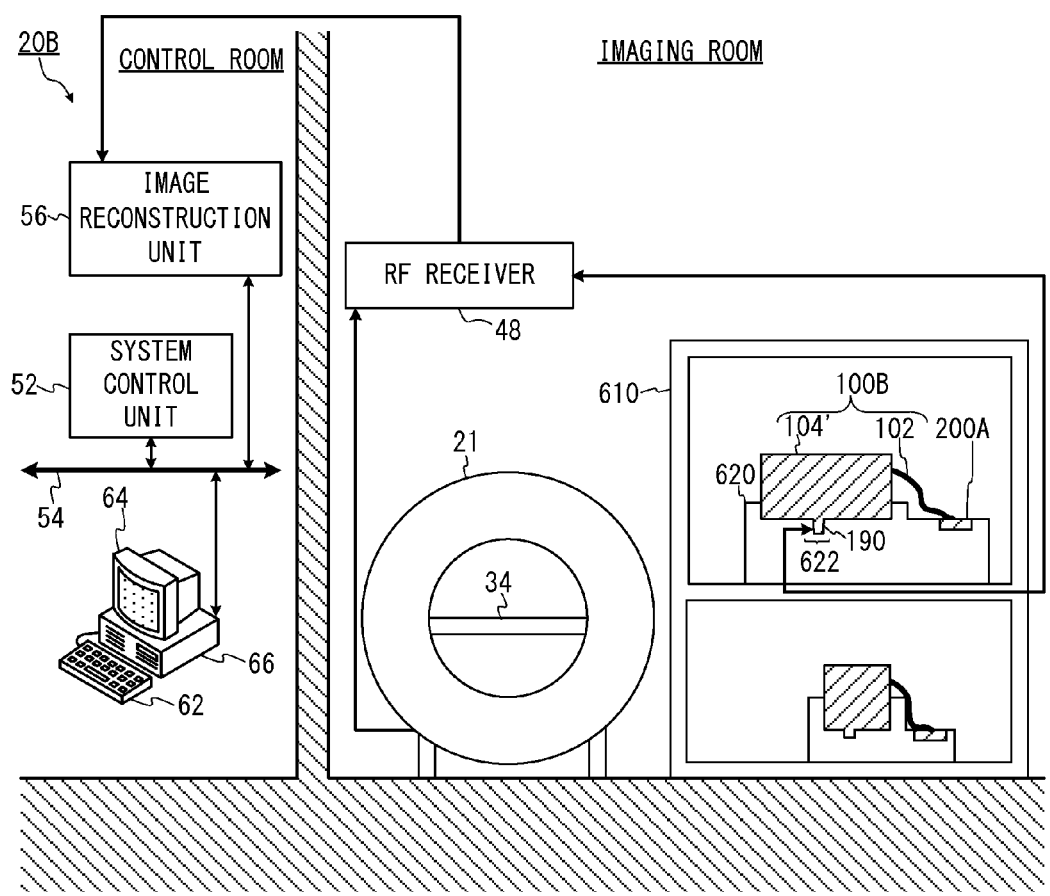
FIG. 13 is a block diagram showing general structure of the MRI apparatus of the second embodiment.

FIG. 13 is a block diagram showing the general structure of the MRI apparatus 20B of the second embodiment. In the control room, the MRI apparatus 20B includes the system control unit 52, the input device 62, the display device 64, the storage device 66, the system bus 54, the image reconstruction unit 56, the image database 58, the image processing unit 60 and so on. Note that, the image database 58 and the image processing unit 60 are not shown in FIG. 13 in order to avoid complication (see FIG. 1).

In addition, in the imaging room, the MRI apparatus 20B includes a data-collecting type charging unit 620, the gantry 21, the bed 32, the table 34, the static magnetic field power supply 40, the shim coil power supply 44, the gradient magnetic field power supply 44, the RF transmitter 46, the RF receiver 48, the RF coil device 100B for the chest part and so on. Note that, the bed 32, the static magnetic field power supply 40, the shim coil power supply 44, the gradient magnetic field power supply 44, the RF transmitter 46 are not shown in FIG. 13 in order to avoid complication (see FIG. 1 and FIG. 4).

The data-collecting type charging unit 620 as one of the main features of the second embodiment is disposed as a charging stand inside the coil rack 610 in which various types of wearable RF coil devices such as an RF coil device for the chest part pr the lumber part are housed. The data-collecting type charging unit 620 is connected to the RF receiver 48 by internal hard wiring, as an example here.

When the RF coil device 100B is put in the data-collecting type charging unit 620, the data-collecting type charging unit 620 starts charging the RF coil device 100B, reads in the data of the MR signals backed up in the memory elements of the RF coil device 100B, and transmits these data to the RF receiver 48.

More specifically, the RF coil device 100B includes a cover member 104' and the cable 102. The cover member 104' is connected to the coil side radio communication device 200A by the cable 102. The structure of the cover member 104' is the same as the cover member 104 of the RF coil device 100A of the first embodiment except the following two points.

Firstly, the cover member 104' includes a connecting unit 190 which is interdigitated with the data-collecting type charging unit 620.

Secondly, inside the cover member 104', "hard wiring connecting the memory elements 160*a* to 160*f* in the data saving unit 150 to the RF receiver 48 via the connecting unit 190 and the data-collecting type charging unit 620" is disposed.

The data-collecting type charging unit 620 includes a connecting unit 622 which is shaped in the form of interdigitating the connecting unit 190 of the cover member 104'. The chassis of the data-collecting type charging unit 620 includes a shape corresponding to the dent parts 321*a* in FIG. 3 on the side opposite to the connecting unit 622, and thereby it is in the form of interdigitating the coil side radio communication device 200A. In addition, the chassis of the data-collecting type charging unit 620 includes a structure corresponding to the power supply unit 320 in FIG. 4 on the side opposite to the connecting unit 622.

Therefore, when the cover member 104' and the coil side radio communication device 200A are respectively interdigitated with the data-collecting type charging unit 620, the data-collecting type charging unit 620 starts to charge the rechargeable battery BA inside the cover member 104' through the cable 102, via an induced magnetic field. At the same time, the data-collecting type charging unit 620 reads in the data of the MR signals backed up in the memory elements 160*a* to 160*f* in the cover member 104' and transmits these data to the RF receiver 48.

During this period, the system control unit 52 may preliminarily input the information identifying the incomplete data part of the MR signals corresponding to a transmission error via hard wiring (not shown), so that the correct data corresponding to the incomplete data part are transmitted to (the frequency downconversion unit 410 of) the RF receiver 48. The judging unit 412 of the RF receiver 48 compensates the incomplete data part of the MR signals corresponding to a transmission error, performs the same processing as the first embodiment, and then inputs the (compensated) raw data of the MR signals to the image reconstruction unit 56.

In addition, the data-collecting type charging unit 620 inputs a command of data erasure to the storage control unit 152 of the cover member 104' via hard wiring (not shown) by way of the connecting unit 190 and 622, after completing transmission of data of the MR signals to the RF receiver 48. The storage control unit 152 erases data stored in each of the memory elements 160*a* to 160*f* in synchronization with the reception timing of the command of data erasure.

Figure 14:
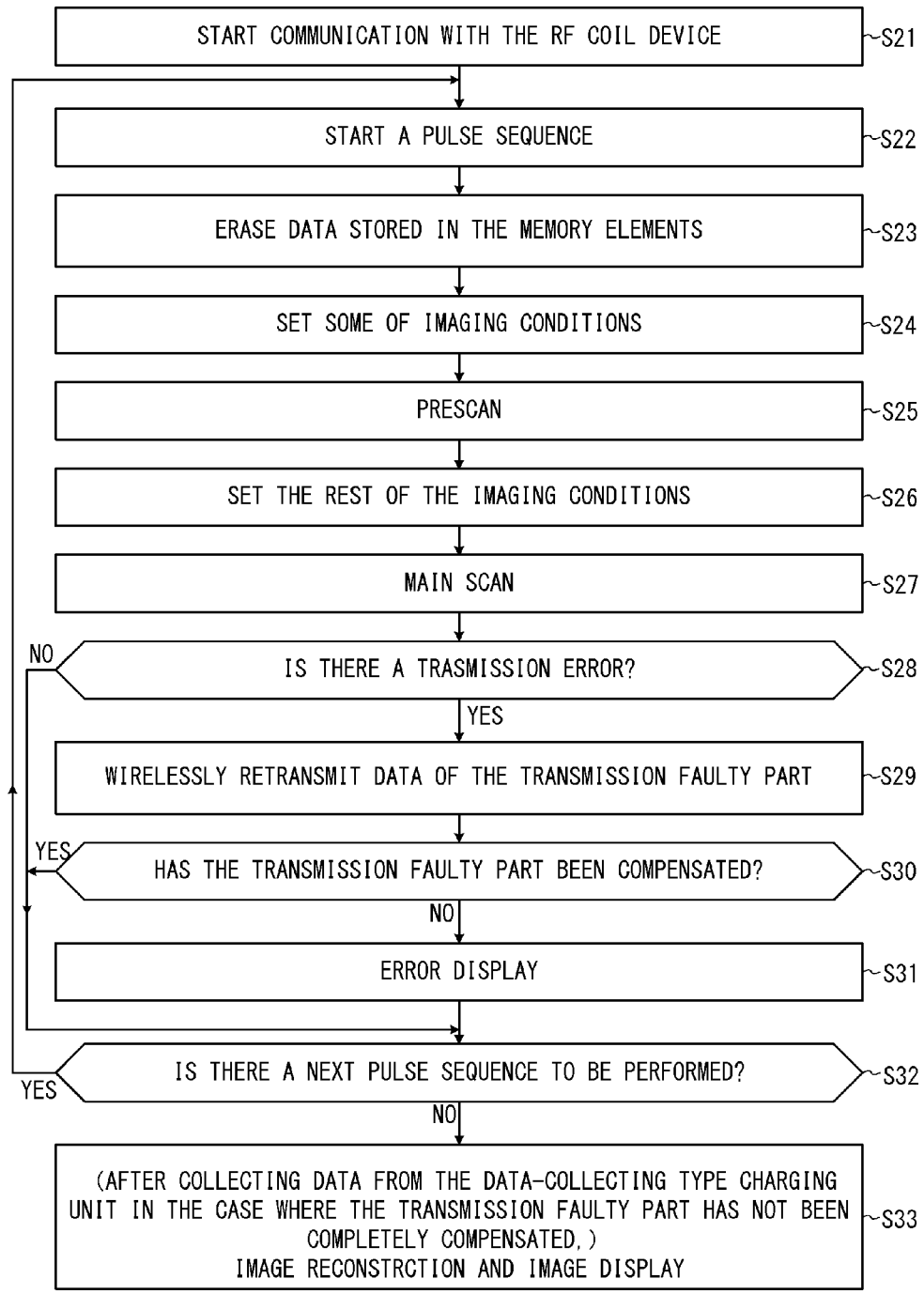
FIG. 14 is a flowchart illustrating an example of flow of the imaging operation performed by the MRI apparatus of the second embodiment.

FIG. 14 is a flowchart illustrating an example of flow of the imaging operation performed by the MRI apparatus 20B of the second embodiment. In the following, according to the step numbers in the flowchart shown in FIG. 14, an operation of the MRI apparatus 20B will be described.

[Step S21 to S30] The processing contents of Step S21 to S30 are the same as Step S1 to S10 in the first embodiment respectively. If an incomplete data part of the MR signals corresponding to a transmission error is not compensated in Step S30, the process proceeds to Step 31. If the incomplete data part is compensated, the process proceeds to Step 32.

[Step S31] Information indicating the existence of an incomplete data part of the MR signals caused by a transmission error is displayed as a guide display in the way similar to FIG. 9. At the same time, the system control unit 52 makes the display device 64 display a message to prompt an operator to collect data. The message is, for example, "Please set the RF coil device 100B and the coil side radio communication device 200A to the data-collecting type charging unit 620, after completion of the pulse sequence".

The "after completion of the pulse sequence" in the above message means after Step S32. This is because the process returns to Step S22 under the state where the table 34 is still inside the gantry if the next pulse sequence to be performed exists for the same object P.

Thus, as an example here, the system control unit 52 keeps the state where the processing of acquiring the identification information from the RF coil device 100B is consecutively performed. After this, the process proceeds to Step S32.

[Step S32] The processing of this Step S32 is similar to Step S13 of the first embodiment.

If the next pulse sequence for the same object P to be performed does not exist, the system control unit 52 brings forward the process to Step S33.

On the other hand, if the next pulse sequence to be performed exists for the same object P, the system control unit 52 returns the process back to Step S22 under the state where the processing of acquiring the identification information from the RF coil device 100B is (still) consecutively performed.

[Step S33] The image reconstruction processing and image display are performed in the way similar to Step S14 of the first embodiment. However, the following processing is performed in front, if the processing of Step S31 has been performed.

More specifically, after completion of imaging, the table driving device 50 moves the table 34 to outside of the gantry 21. Then, as explained with FIG. 13, the RF coil device 100B and the coil side radio communication device 200A are set to the data-collecting type charging unit 620, and the correct data of the MR signals corresponding to the incomplete data part caused by a transmission error are collected. Thereby, after the incomplete data part caused by a transmission error is compensated, the image reconstruction processing is started.

The foregoing is a description of an operation of the MRI apparatus 20B according to the second embodiment.

As just described, the same effects as the first embodiment can be obtained in the second embodiment. Moreover, in the second embodiment, "the processing of collecting the correct data corresponding to the incomplete data part caused by a transmission error" and "data erasure of the memory elements 160a to 160f" are performed in time of charging the RF coil device 100B after completion of the pulse sequence(s) for the object P, if the incomplete data part caused by a transmission error is not successfully compensated. Because data collection is performed while charging the RF coil device 100B, data collection never prolongs a scan time, similar to the first embodiment.

Supplementary Notes on Embodiments

In the following, supplementary notes on the aforementioned embodiments will be explained.

[1] In the first embodiment and the second embodiment, an example in which the data saving unit 150 is disposed inside the cover member 104 of the RF coil device 100A has been explained. However, embodiments of the present invention are not limited to such an aspect. The data saving unit 150 may be disposed inside the coil side radio communication device 200A.

Alternatively, the data saving unit 150 may be disposed to the stage subsequent to the P/S converter 144. In this case, the memory elements inside the data saving unit 150 back up data of the MR signals converted into a serial signal. In this case, if a plurality of coil elements are selected for detection, the MR signals detected by these coil elements may be, for example, backed up in one memory element in one lump.

[2] In the first embodiment, an example in which the data stored in the memory elements 160a to 160f are instantaneously erased at the start timing of each main scan has been explained. However, embodiments of the present invention are not limited to such an aspect. If the memory capacity of each of the memory elements 160a to 160f is sufficiently large, for example, the data stored in the memory elements 160a to 160f may be erased after completing all the pulse sequences for one patient (the same object P). Alternatively, the data stored in the memory elements 160a to 160f may be erased at the timing of restarting the MRI apparatus 20A.

[3] If a plurality of RF coil devices for detecting MR signals are set to one object, these RF coil devices may be connected in parallel to each other, and data of the MR signals detected by one of the RF coil devices may be doubly backed up in the respective memory elements of both RF coil devices.

Figure 15:
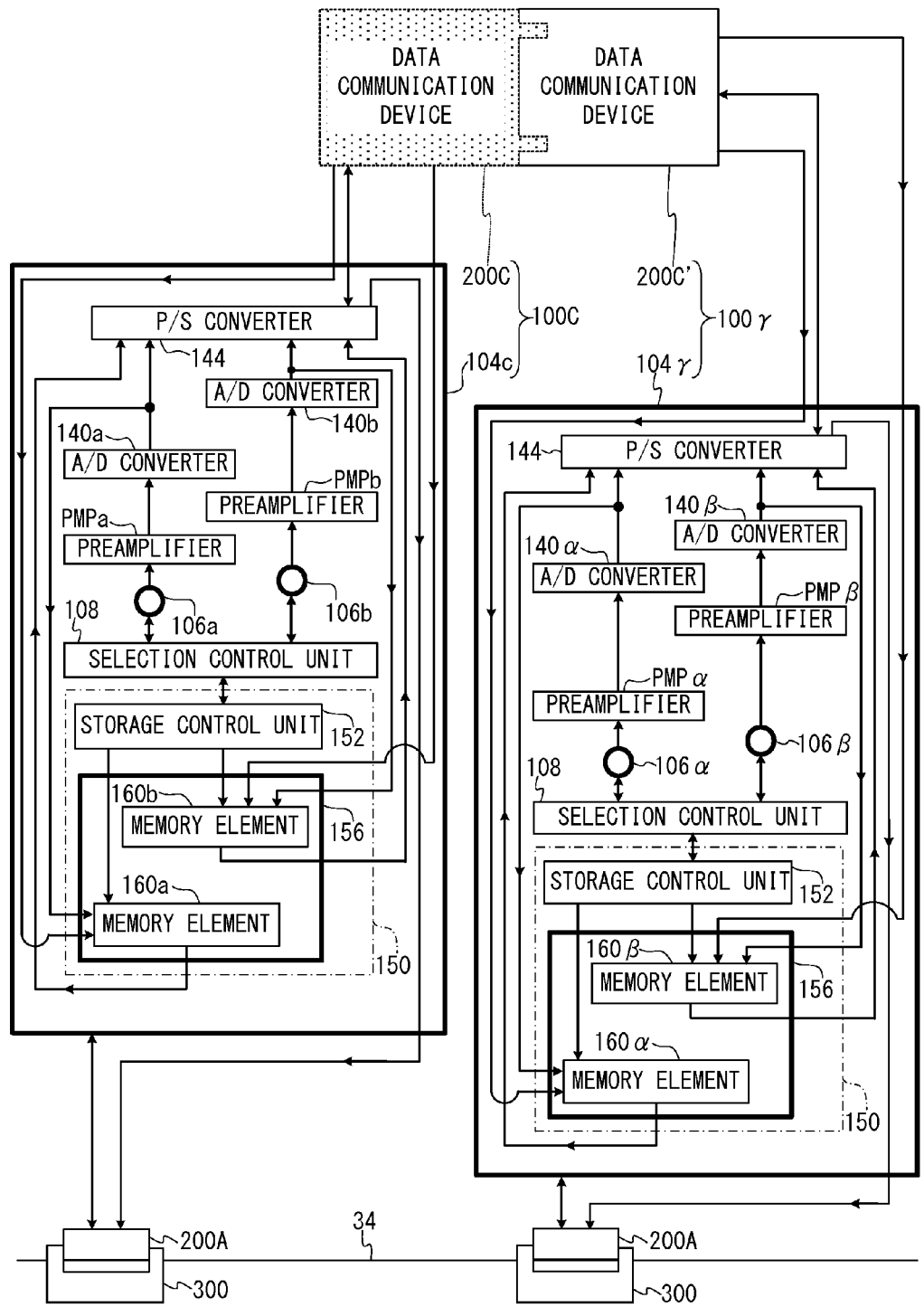
FIG. 15 is a block diagram showing an example of connecting the RF coil device for the lumber part and the RF coil device for the chest part in parallel to each of the control side radio communication devices.

FIG. 15 is a block diagram showing an example of connecting the RF coil device 100γ for the lumber part and the RF coil device 100C for the chest part in parallel to each of the control side radio communication devices 300.

In this example, though only two coil elements are respectively arranged in the RF coil device 100C for the chest part and the RF coil device 100γ for the lumber part for the sake of avoiding complication, three or more than three coil elements may be arranged in each of the RF coil devices 100C and 100γ.

The RF coil device 100C for the chest part includes a data communication device 200C, a cover member 104c and a cable (not shown), and is connected to the coil side radio communication device 200A via the cable. The coil side radio communication device 200A connected to the RF coil device 100C for the chest part is closely fixed to one control side radio communication device 300. The MR signals detected by the RF coil device 100C for the chest part are wirelessly transmitted between the coil side radio communication device 200A and the control side radio communication device 300 via an in an induced electric field as described earlier.

The RF coil device 100γ for the lumber part includes a data communication device 200C', a cover member 104γ, and a cable (not shown), and is connected to the coil side radio communication device 200A via the cable. The coil side radio communication device 200A connected to the RF coil device 100γ for the lumber part is closely fixed to another control side radio communication device 300 different from that for the RF coil device 100C for the chest part. The MR signals detected by the RF coil device 100γ for the lumber part are wirelessly transmitted between the coil side radio communication device 200A and the control side radio communication device 300 via an induced electric field as described earlier.

Inside the cover member 104c of the RF coil device 100γ for the lumber part, each of coil elements 106α, 106β are disposed for detecting the MR signals from the lumber part. Although components such as the rechargeable battery BA are disposed inside the cover member 104c in the way similar to the cover member 104 in FIG. 4, they are not shown in FIG. 15 in order to avoid complication.

The data communication devices 200C and 200C' respectively include components for the radio communication via an induced electric field such as induced electric field combined couplers. The chassis of the data communication device 200C has a plurality of juts interdigitated with the data communication device 200C'. The chassis of the data communication device 200C' has insertion holes interdigitated with the above plurality of juts. Thereby, the data communication devices 200C and 200C' are fixed in close contact with each other.

Note that, antennas are disposed inside each of the chassis. Thus, even if the chassis of each of the data communication devices 200C and 200C' is fixed in close contact with each other, each of their antennas never contacts another antenna, and there is no problem on the radio communication.

The data communication device 200C wirelessly transmits the MR signals detected by the RF coil device 100C for the chest part to the data communication device 200C' via an induced electric field in the way similar to the first embodiment. That is, the MR signals detected by the coil elements 106a and 106b of the RF coil device 100C for the chest part are respectively amplified by the preamplifier PMPa and PMPa, then respectively subjected to A/D conversion in the A/D converter 140a and 140b, then converted into a serial signal in the P/S converter 144, and then wirelessly transmitted to the data communication device 200C'.

The data communication device 200C' converts the received serial signal into the original parallel signals (a plurality of digitized MR signals corresponding to the respective coil elements 106a and 106b). After this, the data communication device 200C' inputs the MR signals detected by the coil elements 106a to the memory element 160a, and inputs the MR signals detected by the coil elements 106b to the memory element 1608.

The storage control unit 152 of the RF coil device 100γ for the lumber part stores "the MR signals wirelessly transmitted after being detected by the coil elements 106a" and "the MR signals detected by the coil elements 106α of the RF coil device 100γ for the lumber part amplified by the preamplifier PMPa, and digitized by the A/D converters 140α" in the memory element 160α.

In addition, the storage control unit 152 of the RF coil device 100γ for the lumber part stores "the MR signals wirelessly transmitted after being detected by the coil elements 106b" and "the MR signals detected by the coil elements 106β of the RF coil device 100γ for the lumber part amplified by the preamplifier PMPβ and digitized by the A/D converters 140γ" in the memory element 160β.

Similarly, the MR signals detected by the coil elements 106α and 106β of the RF coil device 100γ for the lumber part are respectively converted into a serial signal in the P/S converter 144, and then wirelessly transmitted from the data communication device 200C' to the data communication device 200C. The data communication device 200C converts the received serial signal into the parallel signals as described earlier. The data communication device 200C inputs the MR signals detected by the coil elements 106α to the memory element 160a, and inputs the MR signals detected by the coil elements 106β to the memory element 160b.

The storage control unit 152 of the RF coil device 100C for the chest part stores "the MR signals wirelessly transmitted after being detected by the coil elements 106α" and "the MR signals detected by the coil elements 106a digitized by the A/D converters 140a" in the memory element 160a.

In addition, the storage control unit 152 of the RF coil device 100C for the chest part stores "the MR signals wirelessly transmitted after being detected by the coil elements 106β" and "the MR signals detected by the coil elements 106b and digitized by the A/D converters 140b" in the memory element 160b.

As just described, the MR signals respectively detected by the coil elements 106a, 106b, 106α and 106β of the RF coil device 100C for the chest part and the RF coil device 100γ for the lumber part are doubly backed up by the respective memory elements 160a, 160b, 160α and 160β inside the RF coil device 100C for the chest part and the RF coil device 100γ for the lumber part. Thereby, the MRI apparatus 20B can make absolutely sure to protect data of the MR signals.

[4] If a plurality of RF coil devices for detecting MR signals are set to an object, these RF coil devices may be connected in series and only the coil side radio communication device on the side of one RF coil device may be closely fixed to the control side radio communication devices 300.

Figure 16:
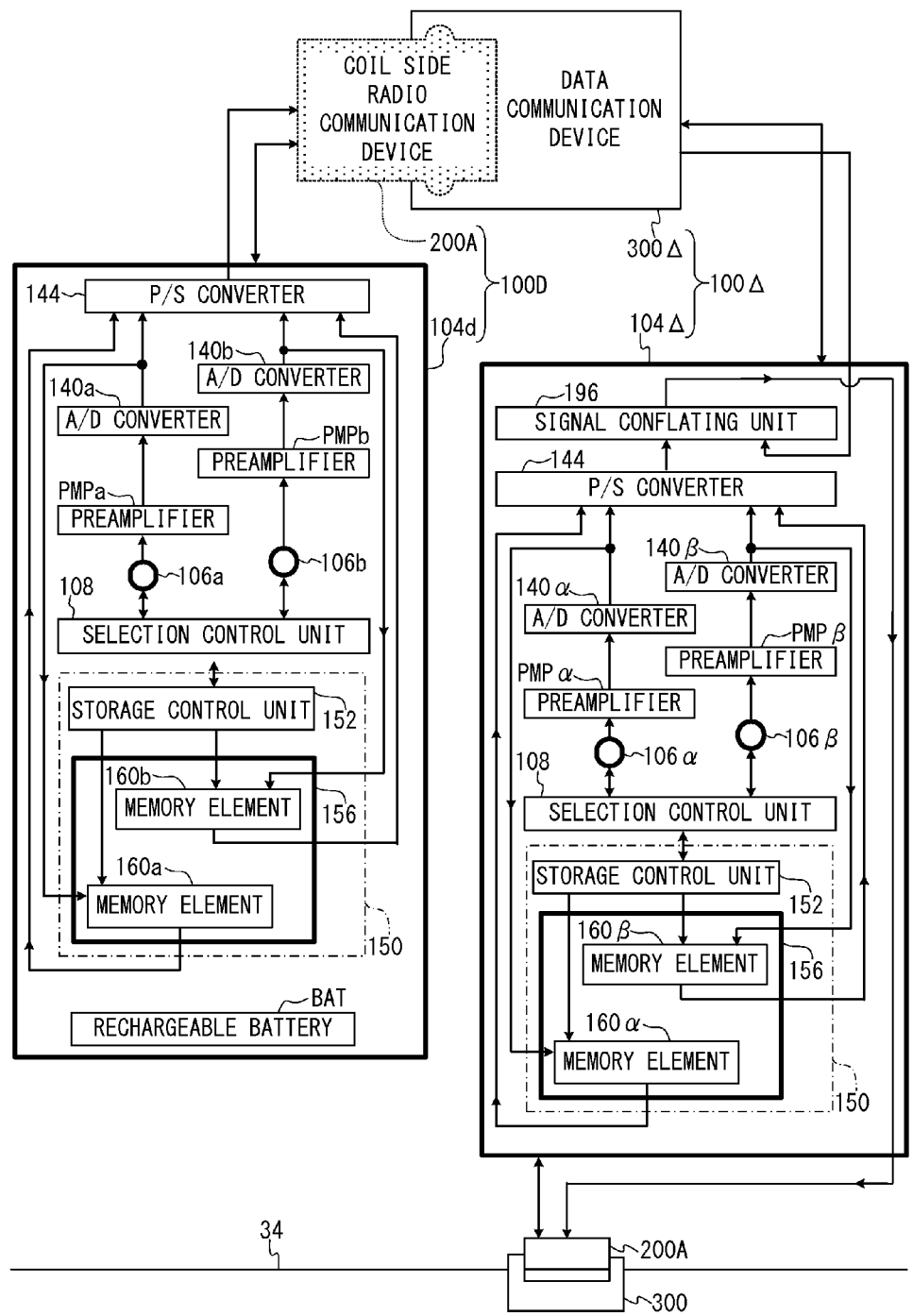
FIG. 16 is a block diagram showing an example of mutually connecting the RF coil device for the lumber part, the RF coil device for the chest part, and one control side radio communication device in series.

FIG. 16 is a block diagram showing an example of mutually connecting the RF coil device 100A for the lumber part, the RF coil device 100D for the chest part, and one control side radio communication device 300 in series.

The RF coil device 100D for the chest part includes a cover member 104d, the coil side radio communication device 200A and a cable (not shown) connecting these components each other.

As an example here, the structure of the cover member 104d is the same as the cover member 104 of the first embodiment, except including a rechargeable battery BAT preliminarily charged before imaging instead of the rechargeable battery BA charged via an induced magnetic field.

The rechargeable battery BAT supplies electric power to each component of the RF coil device 100D for the chest part via hard wiring (not shown).

The RF coil device 100Δ for the lumber part includes a data communication device 300Δ, a cover member 104Δ and a cable (not shown). The RF coil device 100D for the chest part is connected to another coil side radio communication device 200A by the cable. The structure of the cover member 104Δ is the same as the cover member 104γ explained with FIG. 15 except the following two points.

Firstly, the memory elements 160α and 160β do not store the MR signals detected by the RF coil device 100D for the chest part, but respectively store the digitized MR signals detected by the coil elements 106α and 106β.

Secondly, a signal conflating unit 196 which conflates the following two serial signals into one serial signal is disposed in the cover member 104.

One of the two serial signals is a serial signal of the MR signals which are detected by the coil elements 106a and 106b of the RF coil device 100D for the chest part, digitized, and wirelessly transmitted from the coil side radio communication device 200A to the data communication device 300Δ as a serial signal.

The other of the two serial signals is a serial signal of the MR signals which are detected by the coil elements 106α and 106β of the RF coil device 100Δ for the lumber part, digitized and converted into a serial signal by the P/S converter 144.

That is, the signal conflating unit 196 inputs the serial signal including the MR signals detected by the four coil elements 106a, 106b, 106α and 106β into the coil side radio communication device 200A.

The coil side radio communication device 200A on the side of the RF coil device 100Δ for the lumber part is closely fixed to the control side radio communication devices 300 on the table 34, and wirelessly transmits the serial signal inputted from the signal conflating unit 196 to the control side radio communication device 300 in the way similar to the first embodiment.

The data communication device 300Δ is shaped in the form of interdigitating the coil side radio communication device 200A like the control side radio communication device 300. The data communication device 300Δ includes components for the radio communication via an induced electric such as induced electric field combined couplers. The data communication device 300Δ receives "the serial signal including the MR signals detected by the coil elements 106a and 106b" from the coil side radio communication device 200A on the side of the RF coil device 100D for the chest part, by way of the radio communication via an induced electric field.

As just described, when a plurality of RF coil devices for detecting MR signals are connected in series and only the coil side radio communication device on the side of one RF coil device is closely fixed to the control side radio communication device 300, the number of the control side radio communication devices 300 to be used is only one. In this case, the channel number of the RF receiver 48 to be used can be reduced.

[5] The modified embodiments in which a plurality of RF coil device for detecting MR signals are connected in series or in parallel described with FIG. 15 and FIG. 16 can be applied to cases of using RF coil devices for other parts such as the head and the shoulder. In addition, the number of the RF coil devices connected in series or in parallel is not limited to two, but it may be three or more than three.

[6] While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
an RF coil assembly that includes an analog to digital converter and digital storage configured to detect a nuclear magnetic resonance (NMR) signal emitted from an object, digitize the NMR signal and store a digitized NMR signal in the digital storage;
a radio frequency (RF) transmitter that wirelessly transmits the digitized NMR signal;
an RF receiver that wirelessly receives the digitized NMR signal from the RF transmitter;
an image reconstruction circuit that reconstructs image data of the object based on the digitized NMR signal received by the RF receiver; and
a system controller configured to judge whether radio communication between the RF transmitter and the RF receiver is normal or not,
wherein the RF transmitter is configured to wirelessly transmit identification information of the RF coil assembly to the RF receiver; and
the system controller is configured to judge whether the radio communication between the RF transmitter and the RF receiver is normal or not, based on the identification information received by the RF receiver.

2. The magnetic resonance imaging apparatus according to claim 1, wherein
the system controller is configured to identify an incomplete data part in data of the digitized NMR signal, when the system controller judges that the transmission error is present; and
the RF transmitter is configured to wirelessly retransmit data including correct data corresponding to the incomplete data part to the RF receiver, when the system controller judges that the transmission error is present.

3. The magnetic resonance imaging apparatus according to claim 1, further comprising a notification circuit configured to notify that the radio communication is not normal, when the system controller judges that the radio communication between the RF transmitter and the RF receiver is not normal.

4. The magnetic resonance imaging apparatus according to claim 3, wherein the digital storage includes an memory element in which data of the digitized NMR signal are stored and erased electrically or by laser.

5. The magnetic resonance imaging apparatus according to claim 4, wherein the digital storage includes a semiconductor memory element in which data of the digitized NMR signal are electrically stored, and an electric field shield covering the semiconductor memory element.

6. The magnetic resonance imaging apparatus according to claim 4, further comprising a data collecting circuit configured to be connectable with the memory element and read in data of the digitized NMR signal stored in the memory element;
wherein the memory element is configured to be detachable from the digital storage and the collecting circuit.

7. The magnetic resonance imaging apparatus according to claim 1, wherein the RF transmitter is configured to wirelessly transmit the digitized NMR signal via an induced electric field; and
the RF receiver is configured to wirelessly receive the digitized NMR signal from the RF transmitter, via an induced electric field.

8. The magnetic resonance imaging apparatus according to claim 7, wherein the digital storage is configured to store the digitized NMR signal as data in a frequency space.

9. The magnetic resonance imaging apparatus according to claim 1, wherein the RF coil assembly includes a plurality of coil elements respectively configured to detect the NMR signal from the object, and a selection controller configured to select at least one of the plurality of coil elements used for a scan which is an operation of acquiring NMR signals by the magnetic resonance imaging apparatus; and
the digital storage is configured to store, during implementation term of the scan, the NMR signal detected by a coil element selected by the selection controller.

10. The magnetic resonance imaging apparatus according to claim 9, wherein the RF coil assembly includes a plurality of trap circuits configured to respectively correspond to the plurality of coil elements and switch on/off of function of the plurality of coil elements for detecting the NMR signal, in accordance with control of the selection controller; and
the selection controller is configured to acquire a gate signal stipulating switching timing of impedance of the trap circuits, control the trap circuits based on the gate signal, and judge whether a scan is currently performed or not, based on the gate signal.

11. The magnetic resonance imaging apparatus according to claim 10, wherein the selection controller is configured to judge start timing of the scan based on the gate signal.

12. The magnetic resonance imaging apparatus according to claim 11, wherein digital storage is configured to start erasure of data of the digitized NMR signal stored therein, in synchronization with the start timing of the scan judged by the selection controller.

13. The magnetic resonance imaging apparatus according to claim 9, wherein the RF coil assembly includes a plurality of trap circuits configured to respectively correspond to the plurality of coil elements and switch on/off of function of the plurality of coil elements for detecting the NMR signal; and
the selection controller is configured to judge whether a scan is currently performed or not, based on an electric current value or a voltage value in at least one of the trap circuits.

14. The magnetic resonance imaging apparatus according to claim 13, wherein the selection controller is configured to judge start timing of the scan based on an electric current value or a voltage value in at least one of the trap circuits.

15. The magnetic resonance imaging apparatus according to claim 9, wherein the digital storage includes a plurality of memory elements respectively corresponding to the plurality of coil elements, and stores the digitized NMR signal in a memory element corresponding to a coil element selected by the selection controller during implementation term of the scan.

16. The magnetic resonance imaging apparatus according to claim 1, further comprising:
a rechargeable battery configured to be embedded in the RF coil assembly and supply electric power to the RF coil assembly;
a second RF receiver configured to acquire the digitized NMR signal from the first-mentioned RF receiver, perform frequency conversion processing on the digitized NMR signal, and input data of the digitized NMR signal after the frequency conversion processing into the image reconstruction circuit; and
a data-collecting charging unit configured to be detachable from the RF coil assembly, and charge the rechargeable battery as well as transmit data stored in the digital storage into the second RF receiver in a case of being connected to the RF coil assembly.

17. The magnetic resonance imaging apparatus according to claim 16, wherein the data-collecting charging unit is configured to input a command of data erasure to the digital storage, after completion of transmitting data stored in the digital storage; and
the digital storage is configured to erase data stored therein in a case of receiving the command of data erasure.

18. The magnetic resonance imaging apparatus according to claim 1, further comprising at least two of said RF coil assemblies,
wherein each of the RF coil assemblies includes a communication circuit configured to transmit and receive the NMR signal via an induced electric field;
the digital storage of one of the RF coil assemblies being configured to store the NMR signal detected by said one of the RF coil assemblies, and the NMR signal received by the communication circuit of said one of the RF coil assemblies after being detected by another of the RF coil assemblies; and
the digital storage of said another of the RF coil assemblies is configured to store the NMR signal detected by said another of the RF coil assemblies, and the NMR signal received by the communication device of said another of the RF coil assemblies after being detected by said one of the RF coil assemblies.

19. The magnetic resonance imaging apparatus according to claim 1, further comprising at least two of said RF coil assemblies,
wherein each of the RF coil assemblies includes a communication circuit configured to transmit and receive the NMR signal via an induced electric field;
the communication circuit of one of the RF coil assemblies being configured to wirelessly transmit the NMR signal detected by said one of the RF coil assemblies to the communication circuit of another of the RF coil assemblies; and
the RF transmitter is configured to be connected with said another of the RF coil assemblies, and wirelessly transmit the NMR signal detected by said another of the RF coil assemblies and the NMR signal received by the communication circuit after being detected by said one of the RF coil assemblies.

* * * * *